(12) United States Patent
Nakagawara et al.

(10) Patent No.: US 7,867,636 B2
(45) Date of Patent: Jan. 11, 2011

(54) TRANSPARENT CONDUCTIVE FILM AND METHOD FOR MANUFACTURING THE SAME

(75) Inventors: Osamu Nakagawara, Rittou (JP); Hiroyuki Seto, Yasu (JP); Yutaka Kishimoto, Yasu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 224 days.

(21) Appl. No.: 11/562,561

(22) Filed: Nov. 22, 2006

(65) Prior Publication Data

US 2008/0050595 A1 Feb. 28, 2008

Related U.S. Application Data

(60) Provisional application No. 60/771,056, filed on Feb. 7, 2006.

(30) Foreign Application Priority Data

| Jan. 11, 2006 | (JP) | ............................ 2006-004270 |
| Jan. 12, 2006 | (JP) | ............................ 2006-005433 |
| Nov. 21, 2006 | (JP) | ............................ 2006-313893 |

(51) Int. Cl.
*H01B 5/14* (2006.01)
(52) U.S. Cl. .................... 428/702; 428/412; 427/109
(58) Field of Classification Search ............... 428/702, 428/412; 427/109
See application file for complete search history.

(56) References Cited

U.S. PATENT DOCUMENTS 3,471,721 A * 10/1969 Moore .................. 310/334
3,846,649 A * 11/1974 Lehmann et al. ............ 310/327
4,297,189 A * 10/1981 Smith et al. ............ 204/192.18

(Continued)

FOREIGN PATENT DOCUMENTS

DE 3639508 A1 5/1987

(Continued)

OTHER PUBLICATIONS

Fukahori et al.; "Transparent Conductive Film and Method of Producing Transparent Conductive Film"; U.S. Appl. No. 12/500,694, filed Jul. 10, 2009.

(Continued)

*Primary Examiner*—Betelhem Shewareged
*Assistant Examiner*—Sathavaram I Reddy
(74) *Attorney, Agent, or Firm*—Keating & Bennett, LLP

(57) ABSTRACT

A ZnO-based transparent conductive film is produced by growing ZnO doped with a group III element oxide on a substrate and has a region with a crystal structure in which a c-axis grows along a plurality of different directions. The transparent conductive film produced by growing ZnO doped with a group III element oxide on a substrate has a ZnO (002) rocking curve full width at half maximum of about 13.5° or more. ZnO is doped with a group III element oxide so that the ratio of the group III element oxide in the transparent conductive film is about 7% to about 40% by weight. The transparent conductive film is formed on the substrate with a SiNx thin film provided therebetween. The transparent conductive film is formed on the substrate by a thin film formation method with a bias voltage applied to the substrate.

5 Claims, 21 Drawing Sheets

U.S. PATENT DOCUMENTS

| | | | |
|---|---|---|---|
| 4,330,596 A * | 5/1982 | Van Assche | 428/428 |
| 5,458,753 A | 10/1995 | Sato et al. | |
| 5,804,466 A * | 9/1998 | Arao et al. | 438/95 |
| 6,252,247 B1 * | 6/2001 | Sakata et al. | 257/57 |
| 6,727,522 B1 | 4/2004 | Kawasaki et al. | |
| 7,064,346 B2 | 6/2006 | Kawasaki et al. | |
| 7,118,936 B2 | 10/2006 | Kobayashi et al. | |
| 2002/0158236 A1 | 10/2002 | Kikkawa et al. | |
| 2003/0186088 A1 * | 10/2003 | Kato et al. | 428/698 |
| 2005/0093396 A1 * | 5/2005 | Larson et al. | 310/320 |
| 2008/0050595 A1 | 2/2008 | Nakagawara et al. | |

FOREIGN PATENT DOCUMENTS

| | | |
|---|---|---|
| JP | 04-324141 A | 11/1992 |
| JP | 06-187833 A | 7/1994 |
| JP | 07-106615 A | 4/1995 |
| JP | 07-249316 A | 9/1995 |
| JP | 08-050815 A | 2/1996 |
| JP | 11-067459 A | 3/1999 |
| JP | 11-233800 A | 8/1999 |
| JP | 11-284209 A | 10/1999 |
| JP | 2000-150900 A | 5/2000 |
| JP | 2000-195101 A | 7/2000 |
| JP | 2000-276943 A | 10/2000 |
| JP | 2001-176673 A | 6/2001 |
| JP | 2002-114598 A | 4/2002 |
| JP | 2003-142169 A | 5/2003 |
| JP | 2004-099412 A | 4/2004 |
| JP | 2004-296616 A | 10/2004 |
| JP | 2006-005115 A | 1/2006 |
| WO | 01/56927 A1 | 8/2001 |
| WO | 2007/080738 A1 | 7/2007 |

OTHER PUBLICATIONS

Official Communication issued in corresponding Chinese Patent Application No. 200680018062.9, mailed on May, 25, 2010.

Yang et al., "Effects of Substrate Temperature and Sputtering Bias-voltage on ZnO:Al Film Structure and Photoelectric Properties", Electronic Components & Materials, Jul. 2004, vol. 23, No. 7. pp. 31-34.

* cited by examiner

Ga$_2$O$_3$ DOPING CONCENTRATION 4.1% BY WEIGHT

FIG.19A    FIG.19B
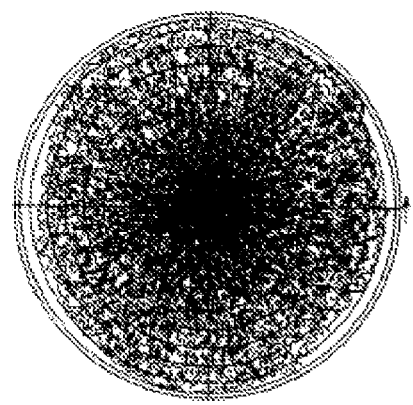
FIG.19C
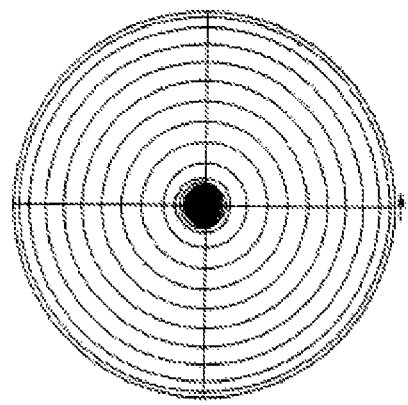
FIG.19D
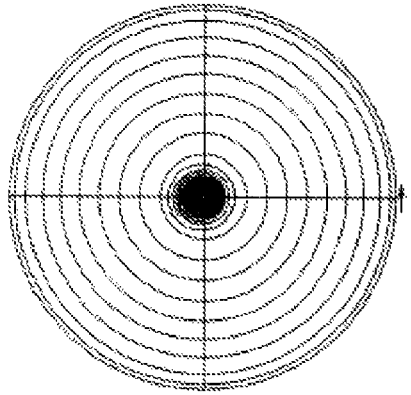
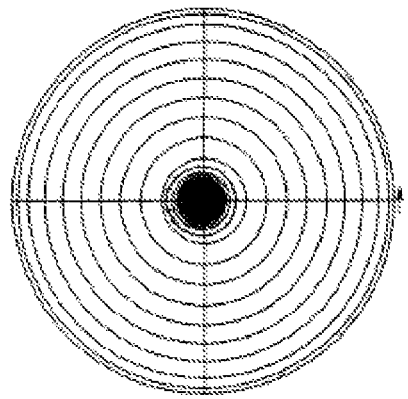

TRANSPARENT CONDUCTIVE FILM AND METHOD FOR MANUFACTURING THE SAME

BACKGROUND OF THE INVENTION

1. Field of the Invention

The present invention relates to a transparent conductive film and a method for producing the same, and more specifically, the present invention relates to a transparent conductive film composed of zinc oxide (ZnO) as a main component and a method for producing the same.

2. Description of the Related Art

In recent year, transparent electrodes have been widely used for flat-panel displays and solar cells. As a material for the transparent electrodes, ITO (indium tin oxide) has been widely used.

However, indium is expensive and there are fears of exhaustion of resources, and thus transparent electrodes using other materials have been increasingly required. As transparent electrodes not using In, the development of ZnO-based transparent electrodes using zinc (Zn) oxide (ZnO) which is low-priced and can be stably supplied has been advanced.

Although ZnO with a stoichiometric composition is an insulator, conductivity can be imparted by excess electrons due to oxygen defects or element replacement (doping) at a Zn site. As such transparent electrodes using ZnO as a main component, transparent electrodes having a resistivity $\rho$ on the order of $10^{-4}$ $\Omega$cm can be produced under the present conditions.

However, ZnO-based transparent conductive films have the problem of insufficient moisture resistance from the viewpoint of practical application. Namely, conventional ZnO-based transparent conductive films contain many oxygen defects and thus have the problem of decreasing the amount of carriers by moisture adsorption (re-oxidation) on the oxygen defects to increase resistance when allowed to stand in a high-humidity environment. As a criteria for moisture resistance of transparent electrodes using ITO, a rate of resistance change after the passage of 720 hours in an atmosphere at 85° C. and 85% RH is ±10%. However, ZnO-based transparent conductive films satisfying this requirement have not yet been obtained.

Furthermore, when a ZnO-based transparent conductive film is formed on a flexible substrate, which is predicted to be widely used in the future, there is the problem of increasing the deterioration in the transparent conductive film by the influence of moisture permeated from the surface of the transparent conductive film and moisture permeated through the flexible substrate because the flexible substrate is permeable to moisture.

In order to resolve the problems, various methods for improving the moisture resistance of ZnO-based transparent conductive films have been investigated. These methods are roughly divided into the following two methods:

(1) A method of providing a SiN barrier layer for suppressing moisture permeation from the substrate side.

(2) A method of improving the quality (crystallinity) of a ZnO film by heating film formation.

However, a ZnO-based transparent conductive film having practicable moisture resistance has not yet been obtained.

Examples of a technique for imparting conductivity by doping ZnO with an element include the following:

(a) A method of doping a ZnO film with an impurity using a molecular beam of any one of the atoms in the group IA (H), the group IIIA (B, Al, Ga, and In), and the group VII (F, Cl, I, and Br) in forming the ZnO film using a ZnO molecular beam or Zn and O molecular beams, for decreasing the electric resistance with high controllability (refer to Japanese Unexamined Patent Application Publication No. 7-106615).

(b) A transparent conductor including a transparent conductive film laminated on a substrate and composed of zinc oxide doped with a group VB or VIB element in the periodic table, the content of the element being 0.1 to 10 atomic % relative to the total number of element atoms and zinc atoms (refer to Japanese Unexamined Patent Application Publication No. 8-050815).

(c) An organic EL element including an anode, a cathode, and an organic layer sandwiched between the two electrodes, the anode including a transparent conductive film composed of a material containing at least one of the oxides of Ir, Mo, Mn, Nb, Os, Re, Ru, Rh, Cr, Fe, Pt, Ti, W, and V (refer to Japanese Unexamined Patent Application Publication No. 11-067459).

(d) A transistor including a transparent conductive material such as conductive ZnO doped or not doped with any one the group II, VII, I, and V elements (refer to Japanese Unexamined Patent Application Publication No. 2000-150900).

(e) A transparent conductive film including a zinc oxide thin film having a c-axis/a-axis orientation ratio of 100:1 or more, the zinc oxide film being doped with at least one of group III and VII compounds of aluminum, gallium, and boron (refer to Patent Document 5: Japanese Unexamined Patent Application Publication No. 2000-276943).

(f) An indium-zinc oxide hexagonal layered compound represented by the general formula, $(ZnO)m.In_2O_3$ (m=2 to 20) wherein an In or Zn element is replaced by at least one element selected from the group consisting of Sn, Y, Ho, Pb, Bi, Li, Al, Ga, Sb, Si, Cd, Mg, Co, Ni, Zr, Hf, Sc, Yb, Lu, Fe, Nb, Ta, W, Te, Au, Pt, and Ge, the layered compound having an average thickness of 0.001 µm to 0.3 µm and an average aspect ratio (average long diameter/average thickness) of 3 to 1000 (refer to International Application Publication No. 2001/056927 pamphlet).

These ZnO-based transparent conductive films have the above-described problem of moisture resistance.

SUMMARY OF THE INVENTION

In order to overcome the problems described above, preferred embodiments of the present invention provide a ZnO-based transparent conductive film having practicable moisture resistance, necessary properties as a transparent conductive film, and excellent economy, and a method for producing the ZnO-based transparent conductive film.

A transparent conductive film according to a preferred embodiment of the present invention includes zinc oxide (ZnO) doped with a group III element and grown on a substrate, the film having a region with a crystal structure in which c axes are oriented in a plurality of different directions.

A transparent conductive film preferably includes zinc oxide (ZnO) doped with a group III element and grown on a substrate, the film having a ZnO (002) rocking curve half-width of about 13.5° or more.

The transparent conductive film preferably is formed on the substrate by thin film formation with a bias voltage applied.

The thin film formation preferably is performed by one method selected from the group consisting of a sputtering method, an evaporation method, an evaporation ion plating method, a laser ablation method, and an arc plasma deposition method.

The transparent conductive film preferably contains zinc oxide (ZnO) as a main component and a group III element oxide at a ratio of about 7% to about 40% by weight.

The transparent conductive film preferably may be formed on the substrate with a SiNx thin film provided therebetween.

The transparent conductive film preferably may be formed on the substrate containing, as a main component, at least one of glass, quartz, sapphire, Si, SiC, polyethylene terephthalate (PET), polyethylene naphthalate (PEN), polyether sulfone (PES), polyimide, cycloolefin polymers, and polycarbonate.

In the transparent conductive film, the group III element preferably is at least one element selected from the group consisting of Ga, Al, and In.

A method for producing a transparent conductive film containing zinc oxide (ZnO) and a group III element includes the step of forming a film on a substrate by a thin film formation method using a material containing zinc oxide (ZnO) and a group III element oxide so that the amount of doping with the group III element oxide is in the range of about 7% to about 40% by weight, to form a transparent conductive film having a region with a crystal structure in which c-axes grow in a plurality of different directions.

The method for producing a transparent conductive film containing zinc oxide (ZnO) and a group III element preferably includes the step of forming a film on a substrate by a thin film formation method using a material containing zinc oxide (ZnO) and a group III element oxide so that the amount of doping with the group III element oxide is in the range of about 7% to about 40% by weight, to form a transparent conductive film having a ZnO (002) rocking curve half-width of about 13.5° or more on the substrate.

The method for producing a transparent conductive film containing zinc oxide (ZnO) and a group III element preferably includes the step of forming a film on a substrate by a method selected from the group consisting of a sputtering method, an evaporation method, an evaporation ion plating method, a laser ablation method, and an arc plasma deposition method using a sintered target composed of a composition containing zinc oxide (ZnO) and a group III element oxide so that the amount of doping with the group III element oxide is in the range of about 7% to about 40% by weight, to form on the substrate a transparent conductive film having a region with a crystal structure in which c axes are oriented in a plurality of different directions.

The method for producing a transparent conductive film containing zinc oxide (ZnO) and a group III element preferably includes the step of forming a film on a substrate by a method selected from the group consisting of a sputtering method, an evaporation method, an evaporation ion plating method, a laser ablation method, and an arc plasma deposition method using a sintered target composed of a composition containing zinc oxide (ZnO) and a group III element oxide so that the amount of doping with the group III element oxide is in the range of about 7% to about 40% by weight, to form on the substrate a transparent conductive film having a ZnO (002) rocking curve half-width of about 13.5° or more.

In the method for producing a transparent conductive film, a relationship between the temperature of the substrate on which the transparent conductive film is formed by the thin film formation method and the amount of doping with the group III element oxide preferably lies in a range defined by points a, b, and c in FIG. 4.

In the method for producing a transparent conductive film, the film preferably is formed by one method selected from the group consisting of a sputtering method, an evaporation method, an evaporation ion plating method, a laser ablation method, and an arc plasma deposition method with a bias voltage applied to the substrate.

In the method for producing a transparent conductive film, the thin film formation method preferably is performed in a vacuum chamber under a back pressure of about $1 \times 10^{-4}$ Pa or less.

The method for producing a transparent conductive film preferably includes forming a SiNx thin film on the substrate and then forming the transparent conductive film on the substrate with the SiNx thin film provided therebetween.

In the method for producing a transparent conductive film, the substrate preferably contains, as a main component, at least one of glass, quartz, sapphire, Si, SiC, polyethylene terephthalate (PET), polyethylene naphthalate (PEN), polyether sulfone (PES), polyimide, cycloolefin polymers, and polycarbonate.

In the method for producing a transparent conductive film, the group III element preferably is at least one element selected from the group consisting of Ga, Al, and In.

Since the transparent conductive film of various preferred embodiments of the present invention preferably is formed by growing zinc oxide (ZnO) doped with the group III element on the substrate and has the region with the crystal structure in which the c-axes grow in a plurality of different direction, it is possible to provide a ZnO-based transparent conducive film having moisture resistance at a practical level and with excellent economy.

In a general transparent conductive film having a single-orientation structure in which crystals are grown in a columnar form and c-axes are oriented in the same direction, moisture enters the film through grain boundaries so as to degrade the moisture resistance. However, in the transparent conductive film of various preferred embodiments of the present invention having the region with the crystal structure in which the c-axes grow in a plurality of different directions, excellent moisture resistance is possibly obtained by a change in the film structure which suppresses re-oxidation of oxygen defects with moisture.

The transparent conductive film of various preferred embodiments of the present invention may have an amorphous region or a region with a so-called quasi-crystalline structure between amorphous and crystal structures, other than the region with the crystal structure in which the c-axes grow in a plurality of different directions.

The transparent conductive film of various preferred embodiments of preferably is formed by growing zinc oxide (ZnO) doped with a group III element on the substrate and has a ZnO (002) rocking curve half-width of about 13.5° or more. In this film, re-oxidation of oxygen defects can be suppressed due to the low degree of C-axis orientation in the same direction. It is thus possible to provide a ZnO-based transparent conductive film having moisture resistance at a practical level and with excellent economy.

Preferred embodiments of the present invention preferably satisfy the requirement that the ZnO (002) rocking curve half-width is about 13.5° or more. This is because in a ZnO film having a ZnO (002) rocking curve half-width of about 13.5° or more, the degree of c-axis orientation in the same direction is sufficiently decreased to a level in which re-oxidation of oxygen defects can be suppressed and prevented.

With the transparent conductive film being formed by thin film formation with a bias voltage applied to the substrate, the moisture resistance can be improved while suppressing the amount of doping with the group III element oxide. It is thus possible to produce a transparent conductive film having low resistance and excellent moisture resistance.

The thin film formation preferably is performed by one method selected from the group consisting of a sputtering method, a vapor deposition method, a deposition ion plating method, a laser ablation method, and an arc plasma deposition method. In this case, the transparent conductive film having low resistance and excellent moisture resistance can be produced with a high efficiency.

The transparent conductive film preferably contains zinc oxide (ZnO) as a main component and the Group III element oxide at a ratio of about 7% to about 40% by weight. As a result, it is possible to efficiently form a transparent conductive film having a region with a crystal structure in which c-axes grow in a plurality of different directions or a transparent conductive film having a ZnO (002) rocking curve half-width of about 13.5° or more. Therefore, various preferred embodiments of the present invention can be made more effective.

The reason that the amount of doping with the group III element oxide is preferably in the range of about 7% to about 40% by weight is that when the amount of doping is less than about 7% by weight, it is difficult to efficiently form a transparent conductive film having a region with a crystal structure in which c-axes grow in a plurality of different directions or a transparent conductive film having a ZnO (002) rocking curve half-width of about 13.5° or more. When the amount of doping exceeds about 40% by weight, it is difficult to form a transparent electrode with practicable low resistivity.

The transparent conductive film preferably is formed on the substrate with a SiNx thin film provided therebetween. In this case, for example, when a substrate that is permeable to water, such as a flexible substrate made of a resin material, is used as the substrate, the moisture permeated through the flexible substrate can be efficiently suppressed and prevented from reaching the transparent conductive film, thereby securing sufficient moisture resistance. Therefore, this preferred embodiment of the present invention can be made more effective.

A substrate containing, as a main component, at least one of glass, quartz, sapphire, Si, SiC, polyethylene terephthalate (PET), polyethylene naphthalate (PEN), polyether sulfone (PES), polyimide, cycloolefin polymers, and polycarbonate can be used. Therefore, in this preferred embodiment of the present invention, it is possible to form, on a substrate composed of such a material, a ZnO-based transparent conductive film having moisture resistance at a practical level and with excellent economy.

In the transparent conductive film, the group III element preferably is at least one element selected from the group consisting of Ga, Al, and In. Therefore, it is possible to securely form a ZnO-based transparent conductive film having moisture resistance at a practical level and with excellent economy.

From the viewpoint of realization of sufficiently low resistance, the group III element (doping element) is preferably Ga. However, even when another group III element, Al or In, is used, the same effect as that obtained by using Ga can be obtained.

The method for producing a transparent conductive film preferably includes forming a film on the substrate by the thin film formation method using a material containing zinc oxide (ZnO) and a group III element oxide so that the amount of doping with the group III element oxide is in the range of about 7% to about 40% by weight. Therefore, it is possible to easily and securely form, on the substrate, a transparent conductive film having a region with a crystal structure in which c-axes grow in a plurality of different directions, without the need for a complicated process.

Any one of various known methods such as a sputtering method, an evaporation method, an evaporation ion plating method, a laser ablation method, an arc plasma deposition method, a CVD method, and a sol-gel method preferably can be used as the thin film formation method.

The method for producing a transparent conductive film preferably includes the step of forming the film on the substrate by the thin film formation method using a material containing zinc oxide (ZnO) and a group III element oxide so that the amount of doping with the group III element oxide is in the range of about 7% to about 40% by weight, to form a transparent conductive film having a ZnO (002) rocking curve half-width of about 13.5° or more on the substrate. Therefore, it is possible to easily and securely form, on the substrate, a transparent conductive film having a region with a crystal structure in which c-axes grow in a plurality of different directions, without the need for a complicated process.

The method for producing a transparent conductive film containing zinc oxide (ZnO) and a group III element includes the step of forming the film on the substrate by a method selected from the group consisting of a sputtering method, an evaporation method, an evaporation ion plating method, a laser ablation method, and an arc plasma deposition method using a sintered target composed of a composition containing zinc oxide (ZnO) and a group III element oxide so that the amount of doping with the group III element oxide is in the range of about 7% to about 40% by weight, to form on the substrate a transparent conductive film having a region with a crystal structure in which c axes are oriented in a plurality of different directions. Therefore, it is possible to efficiently and economically form a ZnO-based transparent conductive film having moisture resistance at a practical level using an apparatus having the same basic configuration as that of a general apparatus for carrying out the thin film formation method.

The relationship between the amount of doping of a ZnO film with a group III element oxide and the ratio of the group III element oxide contained in a target is previously determined so that a ZnO film with a desired amount of doping can be securely formed by the thin film formation method using a sintered target composed of a composition containing zinc oxide (ZnO) and the group III element oxide at a predetermined ratio.

The method for producing a transparent conductive film containing zinc oxide (ZnO) and a group III element preferably includes the step of forming a film on the substrate by a method selected from the group consisting of a sputtering method, an evaporation method, an evaporation ion plating method, a laser ablation method, and an arc plasma deposition method using the sintered target composed of the composition containing zinc oxide (ZnO) and the group III element oxide so that the amount of doping with the group III element oxide is in the range of about 7% to about 40% by weight, to form on the substrate the transparent conductive film having a ZnO (002) rocking curve half-width of about 13.5° or more. Therefore, it is possible to efficiently and economically form a ZnO-based transparent conductive film having moisture resistance at a practical level using an apparatus having the same basic configuration as that of a general apparatus for carrying out the thin film formation method.

In the method for producing a transparent conductive film, the relationship between the temperature of the substrate on which the transparent conductive film is formed by the thin film formation method and the amount of doping with the group III element oxide preferably lies in the range defined by the points a, b, and c in FIG. 4. Therefore, it is possible to efficiently form a transparent conductive film having a region with a crystal structure in which c-axes grow in a plurality of different directions or a transparent conductive film having a ZnO (002) rocking curve half-width of about 13.5° or more. Therefore, the preferred embodiments of the present invention can be made more effective.

In other words, when the transparent conductive film is formed by the thin film formation method, the temperature of the substrate preferably is controlled within the range defined by the points a, b, and c shown in FIG. 4 to control the crystal state of the ZnO film (transparent conductive film) according to the amount of doping with the group III element oxide. Therefore, it is possible to efficiently form a transparent conductive film having a region with a crystal structure in which the c-axes grow in a plurality of different directions or a transparent conductive film having a ZnO (002) rocking curve half-width of about 13.5° or more. Therefore, the preferred embodiments of the present invention can be made more effective.

The gradient of a line connecting the points a and b shown in FIG. 4 can be controlled (changed) according to the film formation conditions, and the gradient of a line connecting the points a and b can be appropriately controlled to more efficiently control the crystal state of a ZnO film, thereby obtaining a transparent conductive film having good characteristics.

In the method for producing a transparent conductive film, the film preferably is formed by one method selected from the group consisting of a sputtering method, an evaporation method, an evaporation ion plating method, a laser ablation method, and an arc plasma deposition method with a bias voltage applied to the substrate. As a result, it is possible to improve the moisture resistance while suppressing the amount of doping with the group III element oxide and to securely produce the transparent conductive film with low resistance and excellent moisture resistance.

In the method for producing a transparent conductive film, the thin film formation method preferably is performed in a vacuum chamber under a back pressure of about $1\times10^{-4}$ Pa or less. In this case, it is possible to more securely produce a ZnO-based transparent conductive film having both resistivity and moisture resistance at a practical level.

The method for producing a transparent conductive film preferably includes forming a SiNx thin film on the substrate and then forming the transparent conductive film on the substrate with the SiNx thin film provided therebetween. In this case, for example, when a substrate that is permeable to water, such as a flexible substrate made of a resin material, is used as the substrate, the moisture permeated through the flexible substrate can be efficiently suppressed and prevented from reaching the transparent conductive film, thereby securing sufficient moisture resistance. Therefore, the preferred embodiments of the present invention can be made more effective.

In the method for producing a transparent conductive film of the present invention, a substrate containing, as a main component, at least one of glass, quartz, sapphire, Si, SiC, polyethylene terephthalate (PET), polyethylene naphthalate (PEN), polyether sulfone (PES), polyimide, cycloolefin polymers, and polycarbonate preferably may be used. The method for producing a transparent conductive film according to various preferred embodiments of the present invention is capable of producing a ZnO-based transparent conductive film with moisture resistance at a practical level and excellent economy on a substrate composed of such a material.

In the method for producing a transparent conductive film, the group III element preferably is at least one element selected from the group consisting of Ga, Al, and In. In this case, it is possible to efficiently form a ZnO-based transparent conductive film having moisture resistance at a practical level and with excellent economy.

From the viewpoint of realization of sufficiently low resistance, the group III element (doping element) is preferably Ga. However, even when another group III element, Al or In, is used, the same effect as that obtained by using Ga can be obtained.

As described above, In is an expensive material, but In preferably is used as an additive (dopant). Therefore, the cost can be significantly decreased as compared with a conventional case in which In is used as a main component.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 19A to 19D are ZnO (002) incident pole figures of X-ray diffraction of respective ZnO films prepared with bias voltages of −80 V to +40 V applied to a substrate.

DETAILED DESCRIPTION OF PREFERRED EMBODIMENTS

The preferred embodiments of the present invention will be described in further detail below with reference to examples.

In a transparent conductive film according to a preferred embodiment of the present invention in which zinc oxide (ZnO) doped with a group III element oxide is grown on a substrate, typical examples of a dopant (group III element) for ZnO include Ga, Al, and In.

When ZnO is doped with such a group III element (group III element oxide), a divalent Zn site is replaced with a trivalent cation to produce excessive electrons as carriers, thereby exhibiting n-type conductivity. Furthermore, ZnO is grown by a deposition method such as a sputtering method, an evaporation method, an evaporation ion plating method, a laser ablation method, an arc plasma deposition method, a CVD method, or a sol-gel method under a condition in which the ratio of the oxygen supplied is lower than the stoichiometric ratio, oxygen defects occur in the formed film to produce electrons as carriers, thereby exhibiting n-type conductivity.

Therefore, ZnO doped with a group III element is a n-type semiconductor having, as carrier supply sources, both the donor-type impurity addition due to site replacement and the electron occurrence due to oxygen defects.

Figure 1:
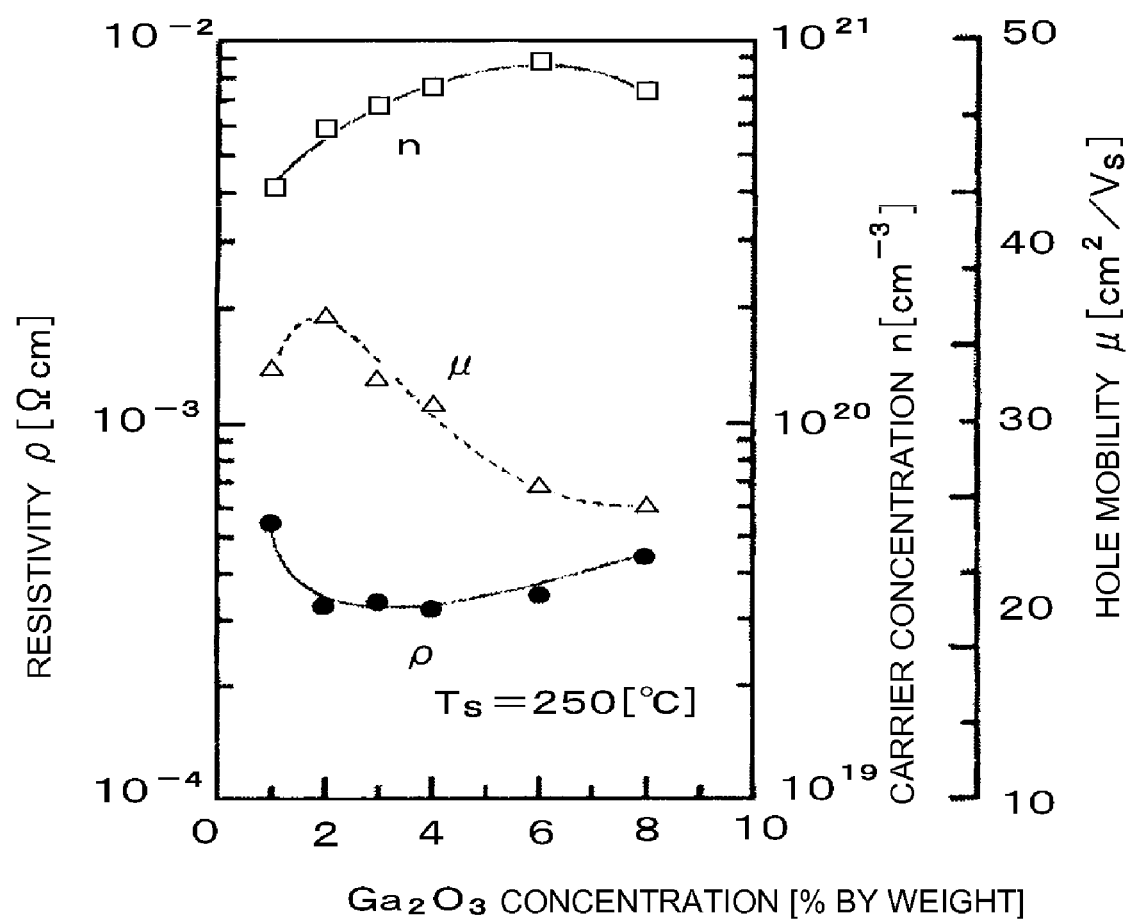
FIG. 1 is a graph showing the relationship between the $Ga_2O_3$ doping concentration and resistivity of a ZnO film (transparent conductive film).

For example, when Ga is used as a dopant for a conductor composed of zinc oxide (ZnO) doped with a group III element, a relationship between the amount of doping and a physical property has been reported in Tadatsugu Minami, J. Vac. Soc. (Vacuum), Vol. 47, No. 10, (2004) 734. As shown in FIG. 1, when the amount of doping is 2% to 4% by weight in terms of $Ga_2O_3$, the resistivity is minimized. Therefore, in view of application to a transparent conductive film, it is advantageous that the amount of doping is in the range of 2% to 4% by weight which permits the formation of a ZnO film with low resistivity.

Since the resistivity relatively increases as the amount of doping increases, the range of the amount of doping can be generally extended to a practical range of about 2% to about 6% by weight. This is because in view of application to a transparent conductive film, it is advantageous to decrease the resistivity as much as possible, and the amount of doping need not be intentionally increased to increase the resistivity.

Figure 2:
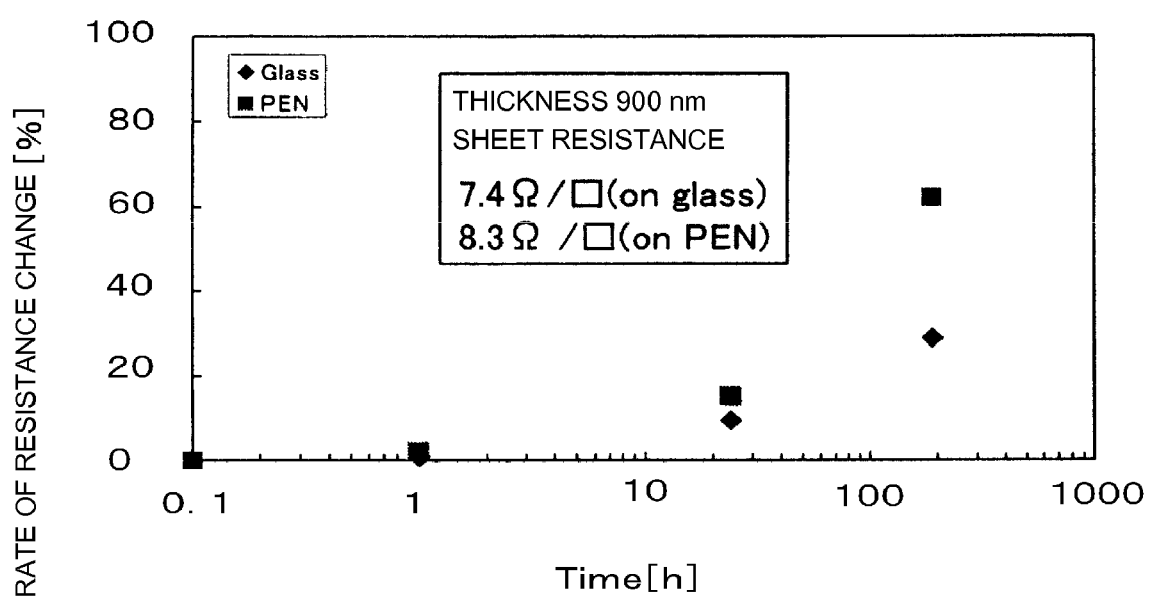
FIG. 2 is a graph showing the relationship between the elapsed time and the rate of resistance change in a moisture resistance test (85° C., 855 RH) for a general ZnO film (transparent conductive film).

However, it has been confirmed that a ZnO film with a reduced amount of doping significantly deteriorates in a moisture resistance test. For example, as a result of a moisture resistance test (85° C., 85% RH) of a ZnO film with an amount of doping of about 2% to about 4% by weight in terms of $Ga_2O_3$ on the basis of the above-described document, it was confirmed that a ZnO film formed on a glass substrate produced a resistance change of about 30% (increase in resistivity), and a ZnO film formed on a flexible substrate including a plastic, PEN (polyethylene naphthalate), produced a resistance change of about 60% after the passage of 200 hours (FIG. 2). Such levels of deterioration in resistivity are impracticable deterioration levels.

In consideration of the fact that deterioration in resistivity (increase in resistivity) of a ZnO film in a moisture resistance test is highly possibly due to the chemical instability of oxygen defects, the inventors used the following methods as countermeasures:

(1) A method of purposefully introducing water into a vacuum chamber to terminate oxygen defects.

(2) A method of heating a substrate to accelerate crystallization.

However, a satisfactory effect could not be obtained by any one of the above-mentioned methods.

Therefore, the inventors conducted further experiments and investigations. As a result, it was discovered that deterioration in resistivity (increase in resistivity) of a ZnO film in a moisture resistance test is significantly suppressed by significantly increasing the amount of doping with a group III element as compared with a usual amount of doping. Repeated further experiments and investigations resulted in the discovery and development of preferred embodiments of the present invention.

As described above, both the site replacement and the oxygen defects contribute to carrier supply to ZnO. However, it is technically difficult to quantitatively analyze the degree of contribution. However, from a qualitative viewpoint, when the contribution of oxygen detects is decreased as much as possible so that the carrier supply is dominated by a rate of the contribution of site replacement, chemical instability can be possibly reduced. Therefore, high-concentration doping was performed, in which the amount of doping with a group III element was significantly increased as compared with a usual amount of doping, and the characteristics of the resulting ZnO film was examined.

In other words, a non-doped ZnO sputtering target and $Ga_2O_3$ pellets to be placed thereon were prepared, and a $Ga_2O_3$-doped ZnO film was formed on a glass substrate by sputtering in which the doping concentration was controlled by the number of the pellets placed on the non-doped ZnO sputtering target. The relationship between the number of the $Ga_2O_3$ pellets and the $Ga_2O_3$ doping concentration was quantitatively determined by ICP composition analysis.

Figure 3:
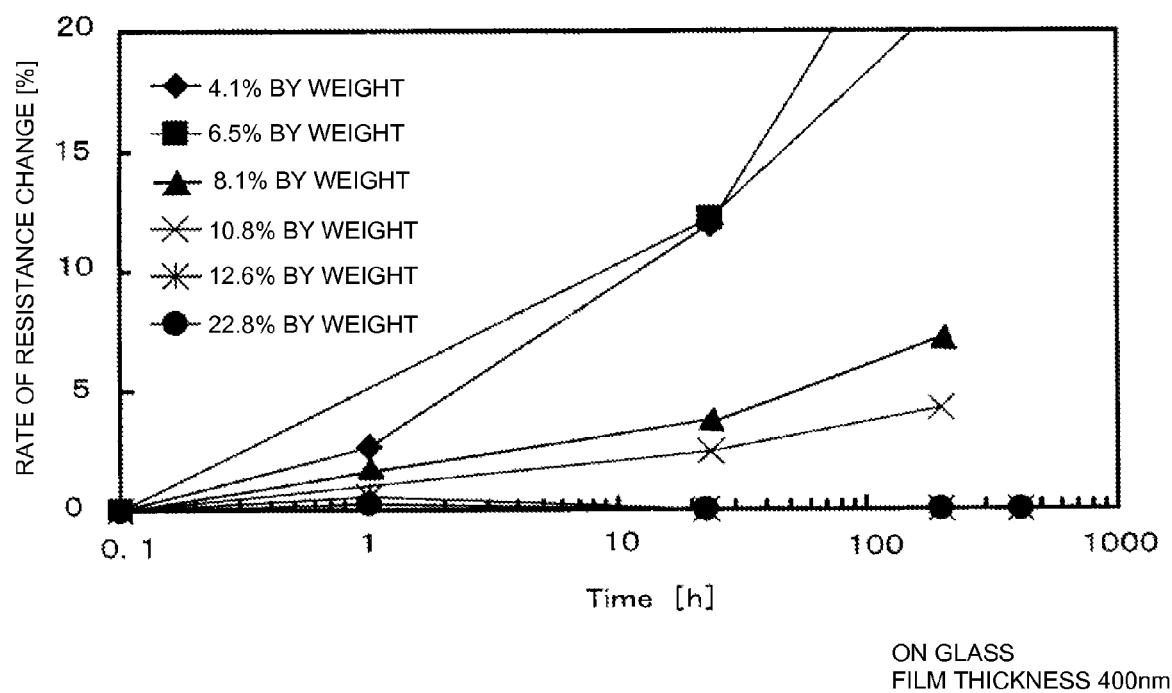
FIG. 3 is a graph showing the relationship between the elapsed time and the rate of resistance change in a moisture resistance test (85° C., 85% RH) of ZnO films (transparent conductive film) according to a preferred embodiment of the present invention.

As a result, it was confirmed that the number of the $Ga_2O_3$ pellets and the $Ga_2O_3$ doping concentration have the following relationship:

(1) Number of $Ga_2O_3$ pellets of 1: $Ga_2O_3$ doping concentration of about 4.1% by weight (2) Number of $Ga_2O_3$ pellets of 1.5: $Ga_2O_3$ doping concentration of about 6.5% by weight (3) Number of $Ga_2O_3$ pellets of 2: $Ga_2O_3$ doping concentration of about 8.1% by weight (4) Number of $Ga_2O_3$ pellets of 2.5: $Ga_2O_3$ doping concentration of about 10.8% by weight (5) Number of $Ga_2O_3$ pellets of 3: $Ga_2O_3$ doping concentration of about 12.6% by weight (6) Number of $Ga_2O_3$ pellets of 5: $Ga_2O_3$ doping concentration of about 22.8% by weight The moisture resistance test (85° C., 85% RH) was performed for samples each having a Ga doping concentration in the range of about 4.1% to about 22.8% by weight. As a result, as shown in FIG. 3, in the samples having a $Ga_2O_3$ doping concentration of about 8.1% by weight or more, significant deterioration (significant increase in rate of resistance change) in resistivity is not observed 200 hours after. On the other hand, when the doping concentration is about 4.1% by weight or about 6.5% by weight lower than the lower limit of about 7.0% by weight of preferred embodiments of the present invention, the rate of resistance change is about 13% 24 hours after and about 20% or more 200 hours after. More specifically, it was confirmed that deterioration in resistivity is increased to fail to obtain a ZnO film at a practical level.

Similarly, a ZnO film was formed on a flexible substrate composed of PEN (polyethylene naphthalate). As a result, it was confirmed that when the $Ga_2O_3$ doping concentration was about 7.0% by weight or more, significant deterioration in resistance was not observed 200 hours after. On the other hand, when the $Ga_2O_3$ doping concentration was lower than about 7.0% by weight, a rate of resistance change is increased, thereby producing undesirable results.

The characteristics of preferred embodiments of the present invention will be described in further detail below with reference to examples.

EXAMPLE 1

A glass substrate composed of non-alkali glass (Corning 7059) was prepared as a substrate, and the glass substrate was washed with isopropyl alcohol and UV irradiation to form a clean surface.

Also, as a sputtering target, a ZnO sintered target having a sintering density of 80% or more and a diameter of 6 inches was prepared.

Furthermore, pellets ($Ga_2O_3$ pellets) of 10 mm in diameter and composed of Ga oxide ($Ga_2O_3$) were prepared for doping.

In Example 1, the $Ga_2O_3$ pellets were placed on an erosion region of the ZnO sintered target and subjected to sputtering to form a $Ga_2O_3$-doped ZnO film on the substrate.

The amount of Ga2O3 doping was controlled by controlling the number of the $Ga_2O_3$ pellets.

In the sputtering, the glass substrate was set in a vacuum chamber of a sputtering apparatus and then sputtering was performed without heating of the glass substrate (substrate) after the chamber was evacuated to $5 \times 10^{-5}$ Pa.

In Example 1, high-purity Ar gas was used as sputtering gas, and the sputtering gas was introduced until the pressure in the vacuum chamber was 1 Pa.

Figure 4:
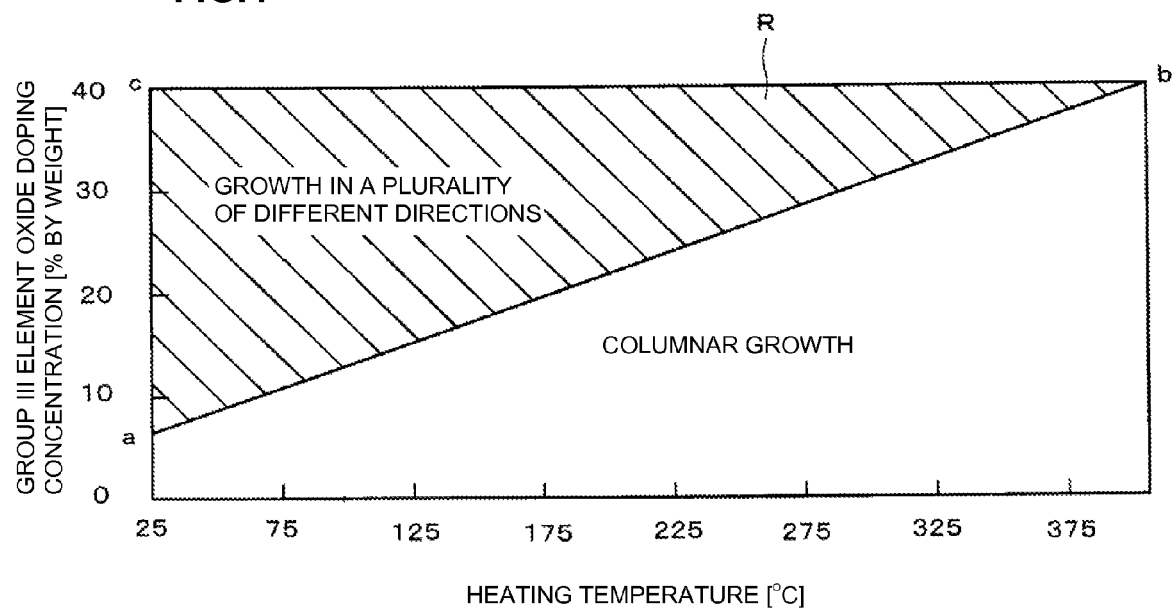
FIG. 4 is a graph showing the relationship between the group III element oxide doping concentration and the heating temperature in the production of a transparent conductive film according to a preferred embodiment of the present invention.

In the method for producing a transparent conductive film according to a preferred embodiment of the present invention, the crystal structure of a ZnO film to be formed can be controlled by heating the substrate. However, in this case, the relationship between the substrate temperature and the amount of group III element oxide doping preferably falls in a triangular region R defined by the points a, b, and c shown in FIG. 4. Furthermore, the crystal structure of the ZnO film can be efficiently controlled by controlling the gradient of a line connecting the points a and b according to the film formation conditions, thereby producing a transparent conductive film having more satisfactory characteristics.

The sputtering was started under the condition of a RF electric power of 500 W to form the ZnO film (transparent conductive film) having a predetermined thickness and doped with Ga at a predetermined ratio. The predetermined thickness of the formed ZnO film was 400 nm.

The formed ZnO film was patterned by wet etching, and then it was confirmed by a stylus-type level-difference meter that the film thickness was about ±15% of the predetermined thickness.

The resistivity measured by four-probe measurement for each of the samples was as follows:

(1) When the number of the $Ga_2O_3$ pellets was 1, the resistivity was about $5.9 \times 10^{-4}$ Ωcm.

(2) When the number of the $Ga_2O_3$ pellets was 3, the resistivity was about $9.1 \times 10^{-4}$ Ωcm.

(3) When the number of the $Ga_2O_3$ pellets was 5, the resistivity was about $4.8 \times 10^{-3}$ Ωcm.

The sheet resistance was as follows:

(1) When the number of the $Ga_2O_3$ pellets was 1, the sheet resistance was about 13 Ω/sq.

(2) When the number of the $Ga_2O_3$ pellets was 3, the resistivity was about 22 Ω/sq.

(3) When the number of the $Ga_2O_3$ pellets was 5, the resistivity was about 116 Ω/sq.

When the number of the $Ga_2O_3$ pellets was any one of 1, 3, and 5, the light transmittance in the visible region reached about 80% or more.

Furthermore, the surface roughness (Rms) of each of the formed ZnO films was as follows:

(1) When the number of the $Ga_2O_3$ pellets was 1, the surface roughness was about 6.969 (first) and about 7.437 (second).

(2) When the number of the $Ga_2O_3$ pellets was 3, the surface roughness was about 4.062 (first) and about 4.834 (second).

(3) When the number of the Ga2O3 pellets was 5, the surface roughness was about 4.091 (first) and about 4.235 (second).

These results indicate that as the doping concentration increases, grain growth is suppressed to flatten the surface of the ZnO film.

The relationship between the number of the $Ga_2O_3$ pellets and the $Ga_2O_3$ doping concentration is as follows:

(1) Number of $Ga_2O_3$ pellets of 1: $Ga_2O_3$ doping concentration of about 4.1% by weight (2) Number of $Ga_2O_3$ pellets of 1.5: doping concentration of about 6.5% by weight (3) Number of $Ga_2O_3$ pellets of 2: $Ga_2O_3$ doping concentration of about 8.1% by weight (4) Number of $Ga_2O_3$ pellets of 2.5: $Ga_2O_3$ doping concentration of about 10.8% by weight (5) Number of $Ga_2O_3$ pellets of 3: $Ga_2O_3$ doping concentration of about 12.6% by weight (6) Number of $Ga_2O_3$ pellets of 5: $Ga_2O_3$ doping concentration of about 22.8% by weight In these samples, when the number of the $Ga_2O_3$ pellets was 2 (i.e., $Ga_2O_3$ doping concentration of about 8.1% by weight) or more, significant deterioration (significant increase in rate of resistance change) was not observed 200 hours after (refer to FIG. 3).

However, it was confirmed that when the number of the $Ga_2O_3$ pellets was 1 ($Ga_2O_3$ doping concentration of about 4.1% by weight) or 1.5 ($Ga_2O_3$ doping concentration of about 6.5% by weight), the rate of resistance change increases with the passage of time, and the rate of resistance was about 13% 24 hours after and about 20% or more 200 hours after.

Figure 5:
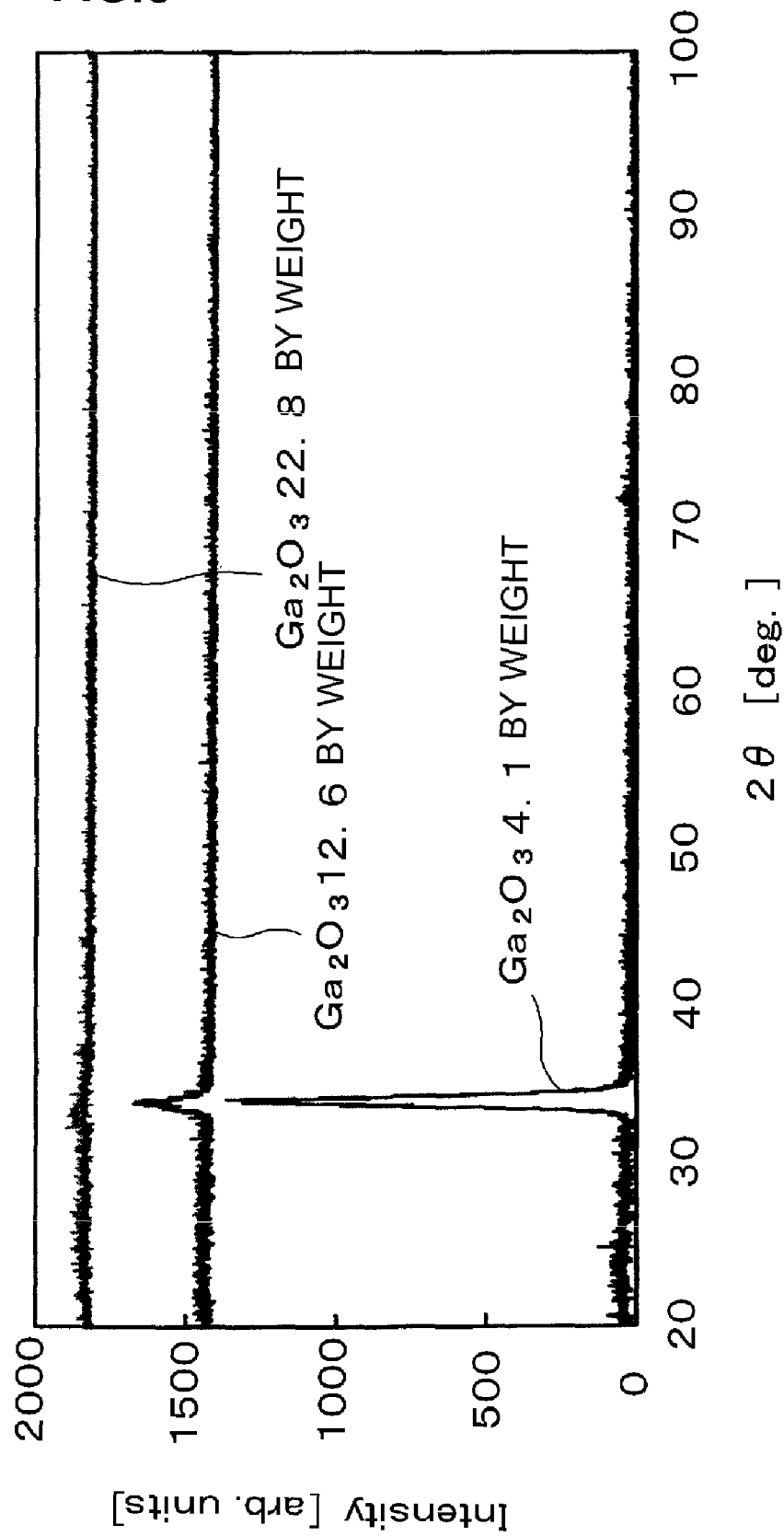
FIG. 5 is a diagram showing the relationship between the $Ga_2O_3$ doping concentration and c-axis orientation of ZnO films (transparent conductive film).

FIG. 5 is a chart showing θ-2θ scan X-ray diffractometry results of the sample (1) with a $Ga_2O_3$ doping concentration of about 4.1% by weight, and the sample (5) with a $Ga_2O_3$ doping concentration of about 12.6% by weight, and the sample (6) with a $Ga_2O_3$ doping concentration of about 22.8% by weight.

FIG. 5 shows that in the sample with a $Ga_2O_3$ doping concentration of about 4.1% by weight, a large c-axis peak appears, while in the sample with a $Ga_2O_3$ doping concentration of about 12.6% by weight, the c-axis peak is significantly decreased, and in the sample with a $Ga_2O_3$ doping concentration of about 22.8% by weight, the c-axis peak disappears. It is thus found that the degree of c-axis orientation weakens as the $Ga_2O_3$ doping concentration increases.

Therefore, it is thought that the moisture resistance of the ZnO film of preferred embodiments of the present invention is improved when the $Ga_2O_3$ doping concentration is increased to weaken c-axis orientation, thereby suppressing re-oxidation of oxygen defects.

Figure 6:
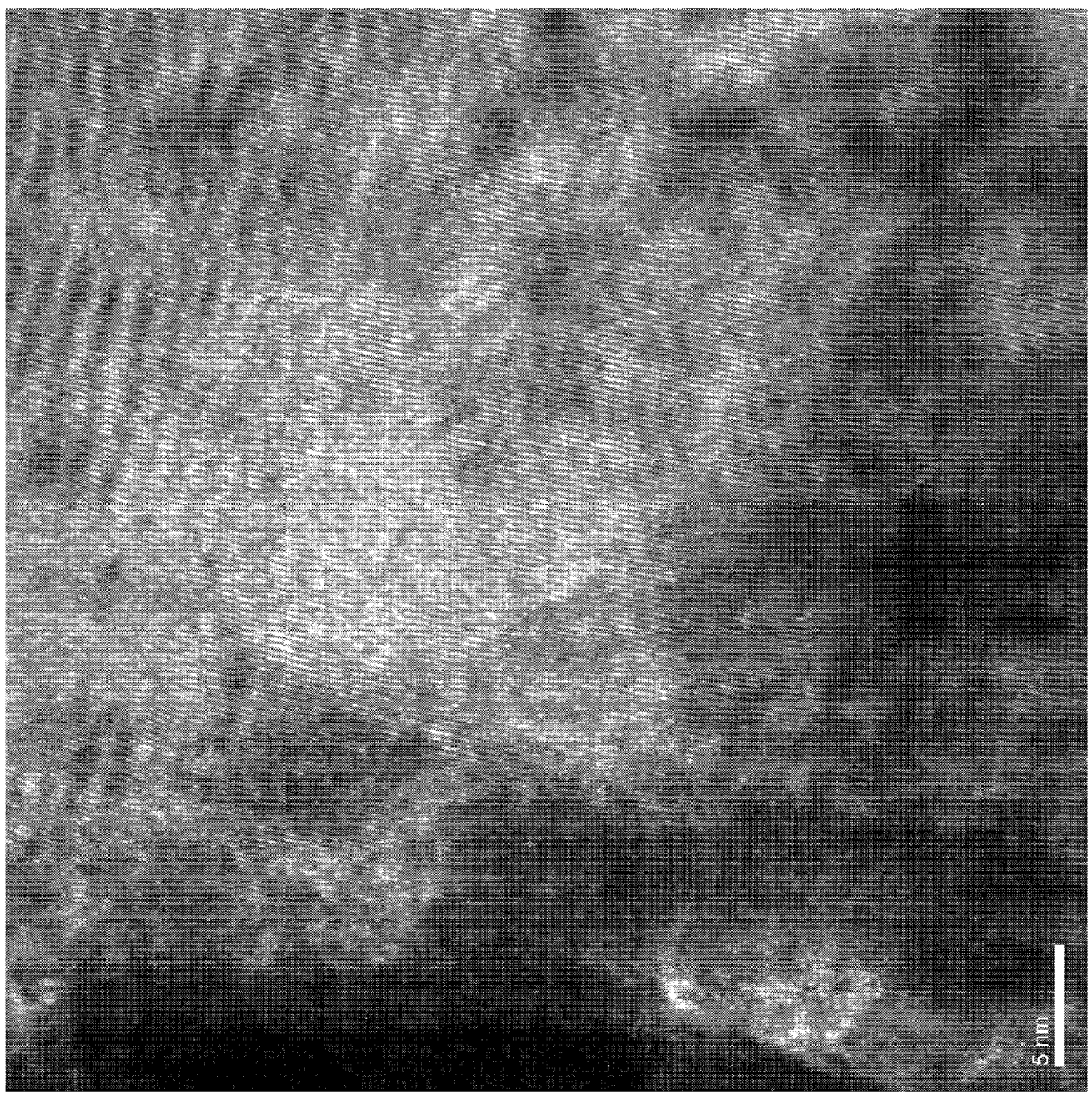
FIG. 6 is a drawing showing a transmission electron microscope image of a sample with a $Ga_2O_3$ doping concentration of 4.1% by weight out of the range of preferred embodiments of the present invention.
Figure 7:
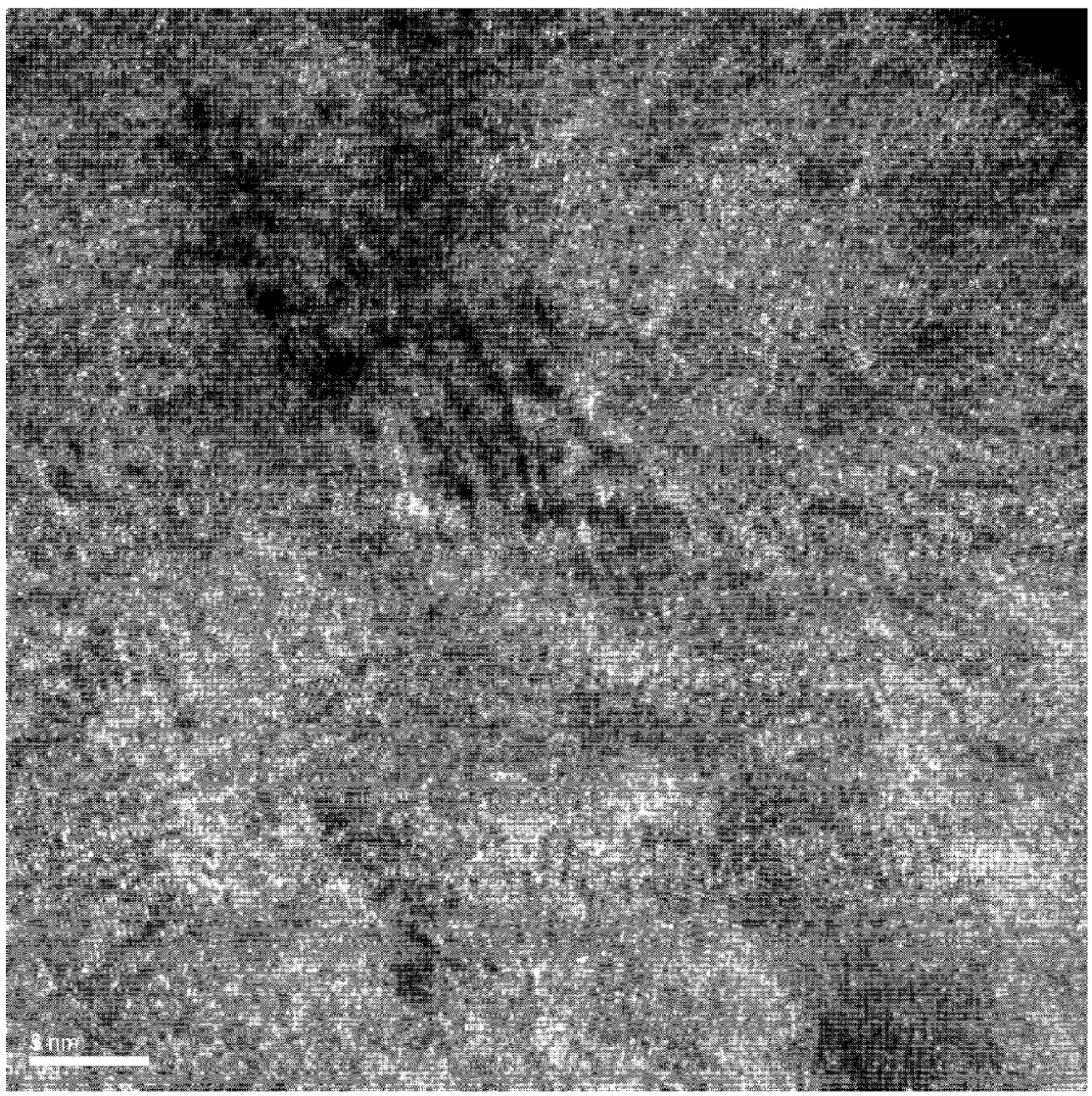
FIG. 7 is a drawing showing a transmission electron microscope image of a sample with a $Ga_2O_3$ doping concentration of about 22.8% by weight within the range of preferred embodiments of the present invention.

FIG. 6 is a view showing a transmission electron microscope image of the sample with a Ga2O3 doping concentration of about 4.1% by weight out of the range of preferred embodiments of the present invention, and FIG. 7 is a view showing a transmission electron microscope image of the sample with a $Ga_2O_3$ doping concentration of about 22.8% by weight within the range of preferred embodiments of the present invention.

Figure 8:
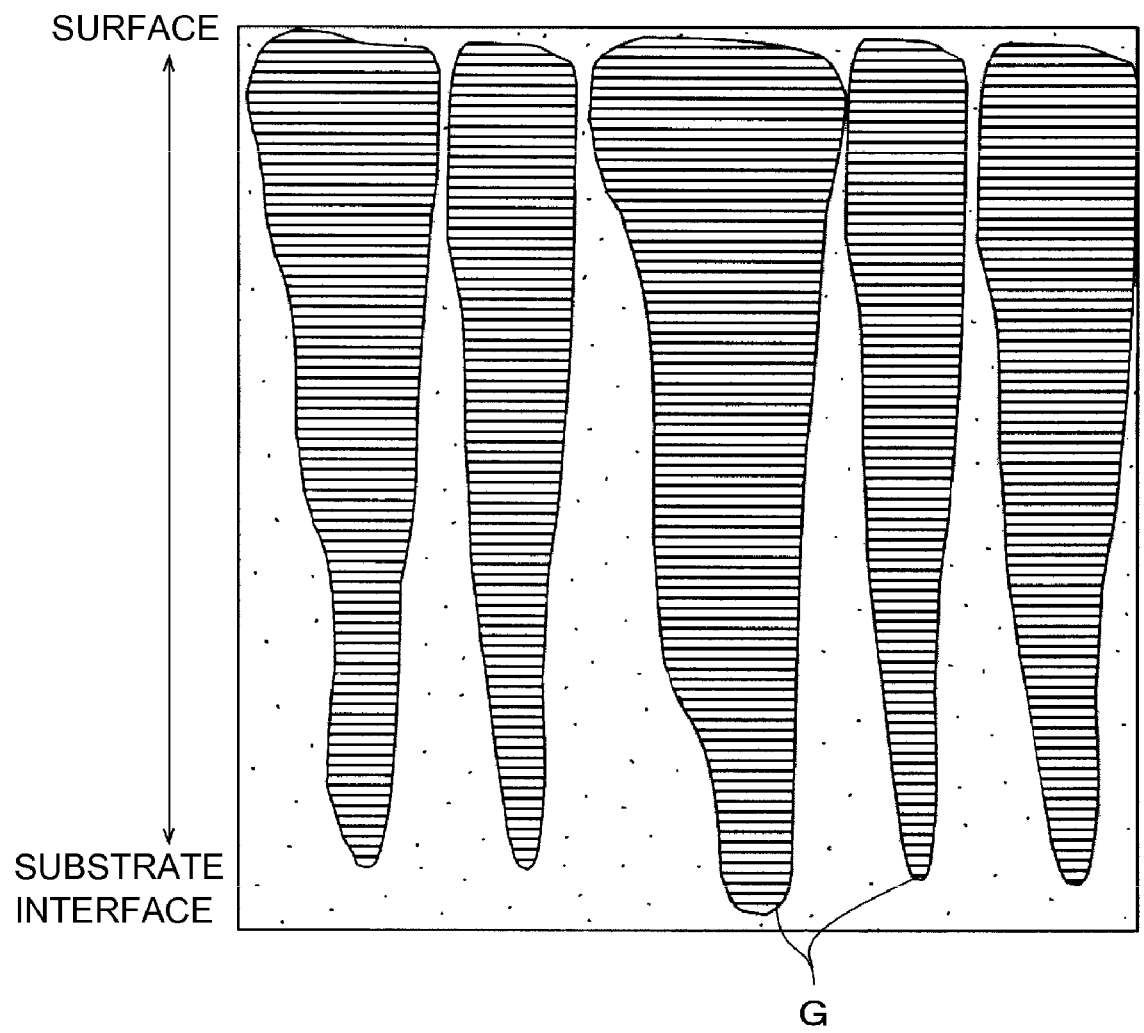
FIG. 8 is a drawing schematically showing the crystal structure of a sample with a $Ga_2O_3$ doping concentration of 4.1% by weight out of the range of preferred embodiments of the present invention.
Figure 9:
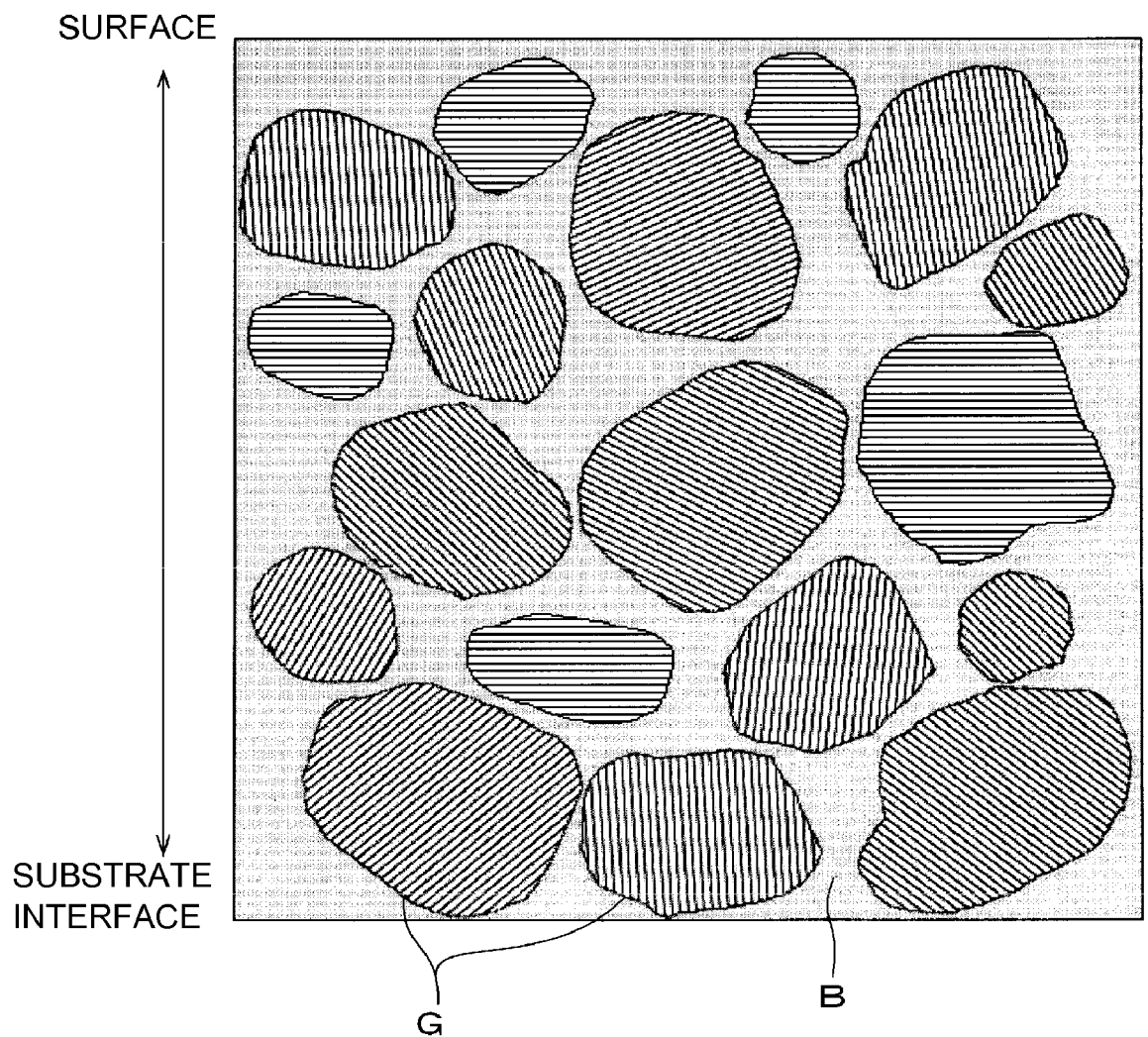
FIG. 9 is a drawing schematically showing the crystal structure of a sample with a $Ga_2O_3$ doping concentration of about 22.8% by weight within the range of preferred embodiments of the present invention.

FIG. 8 is a view schematically showing the crystal structure of the sample with a $Ga_2O_3$ doping concentration of about 4.1% by weight out of the range of preferred embodiments of the present invention, and FIG. 9 is a view schematically showing the crystal structure of the sample with a $Ga_2O_3$ doping concentration of about 22.8% by weight within the range of preferred embodiments of the present invention.

In FIGS. 8 and 9, a plurality of parallel lines in grains G schematically shows lattice spacing.

FIGS. 6 and 8 show that in the ZnO film with a $Ga_2O_3$ doping concentration of as low as about 4.1% by weight out of the range of preferred embodiments of the present invention, c-axes are dominantly oriented in the uniform direction normal to the substrate, and the grains G are columnar and grown in a typical columnar form.

On the other hand, FIGS. 7 and 9 show that in the ZnO film with a $Ga_2O_3$ doping concentration of as high as about 22.8% by weight within the range of preferred embodiments of the present invention, c-axes grow in a plurality of different directions (FIG. 7), and the grains G are not columnar (FIG. 9). It is also supposed that an amorphous region or a region with a so-called quasi-crystalline structure intermediate between amorphous and crystalline structures is present at grain boundaries B.

FIGS. 7 and 9 showing the crystal structure of the ZnO film within the range of preferred embodiments of the present invention can support the idea of preferred embodiments of the present invention that when c-axes grow in a plurality of different directions, re-oxidation of oxygen defects is suppressed to improve the moisture resistance.

Figure 10:
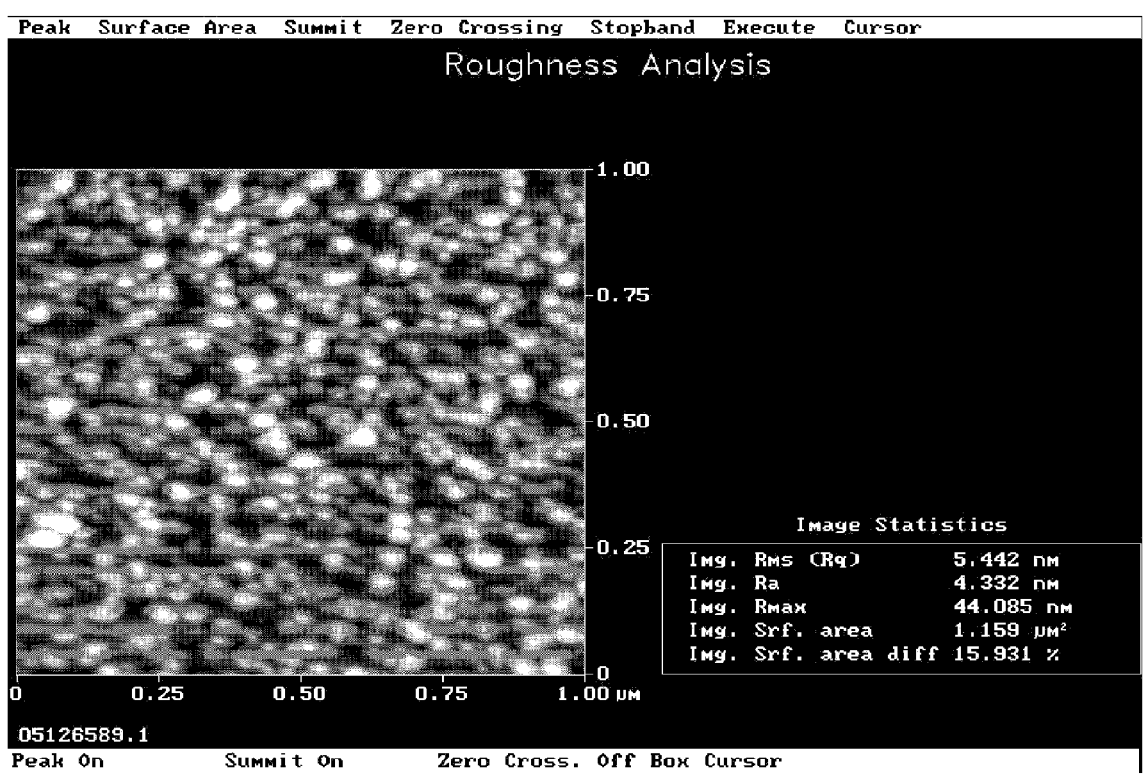
FIG. 10 is an atomic force microscope photograph showing the surface state of a sample with a $Ga_2O_3$ doping concentration of 4.1% by weight out of the range of preferred embodiments of the present invention.
Figure 11:
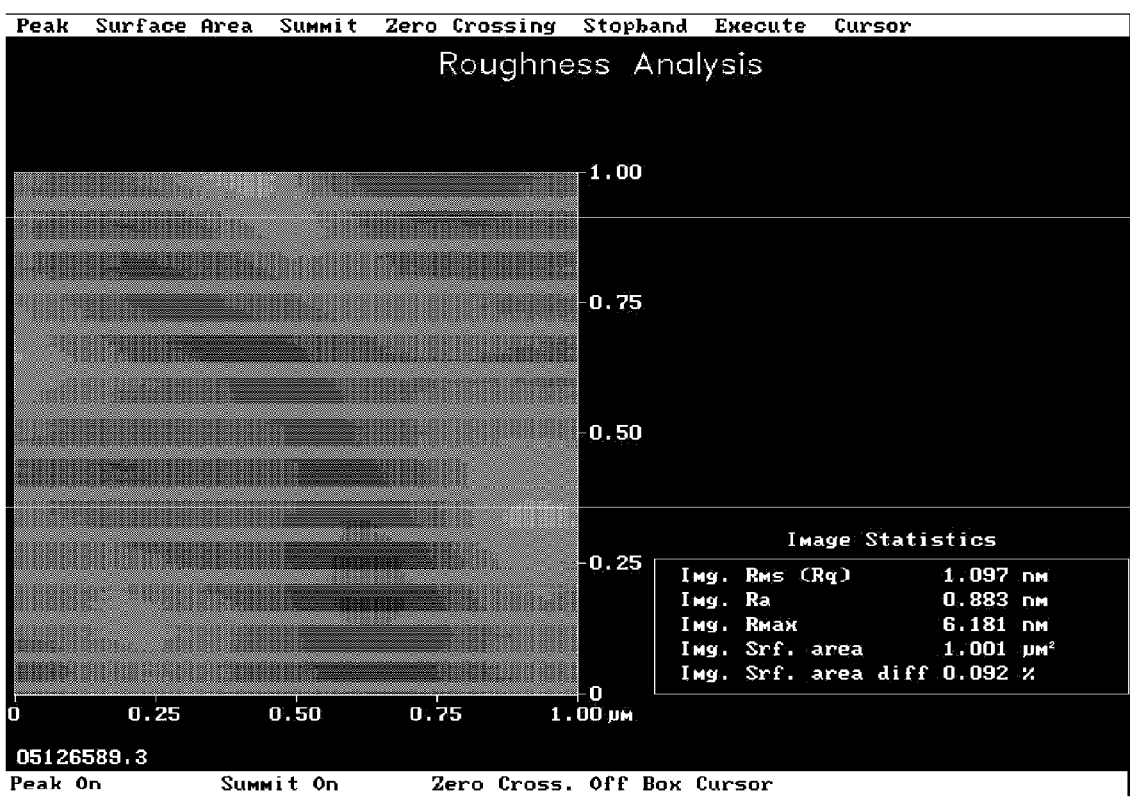
FIG. 11 is an atomic force microscopic photograph showing the surface state of a sample with a $Ga_2O_3$ doping concentration of about 22.8% by weight within the range of preferred embodiments of the present invention.

FIG. 10 shows an atomic force microscope photograph showing the surface state of the sample with a $Ga_2O_3$ doping concentration of about 4.1% by weight out of the range of preferred embodiments of the present invention, and FIG. 11 shows an atomic force microscope photograph showing the surface state of the sample with a $Ga_2O_3$ doping concentration of about 22.8% by weight within the range of preferred embodiments of the present invention.

As shown in FIG. 10, in the sample with a $Ga_2O_3$ doping concentration of about 4.1% by weight out of the range of preferred embodiments of the present invention, irregularity (lumps) due to crystals with uniform C-axis orientation is observed. However, in the sample with a $Ga_2O_3$ doping concentration of about 22.8% by weight within the range of preferred embodiments of the present invention, the surface becomes flat without clear irregularity due to crystals and grain boundaries in the surface because c-axes grow in a plurality of different directions.

FIGS. 10 and 11 also support the idea of preferred embodiments of the invention that when c-axes grow in a plurality of different directions, re-oxidation of oxygen defects is suppressed to improve the moisture resistance.

Figure 12:
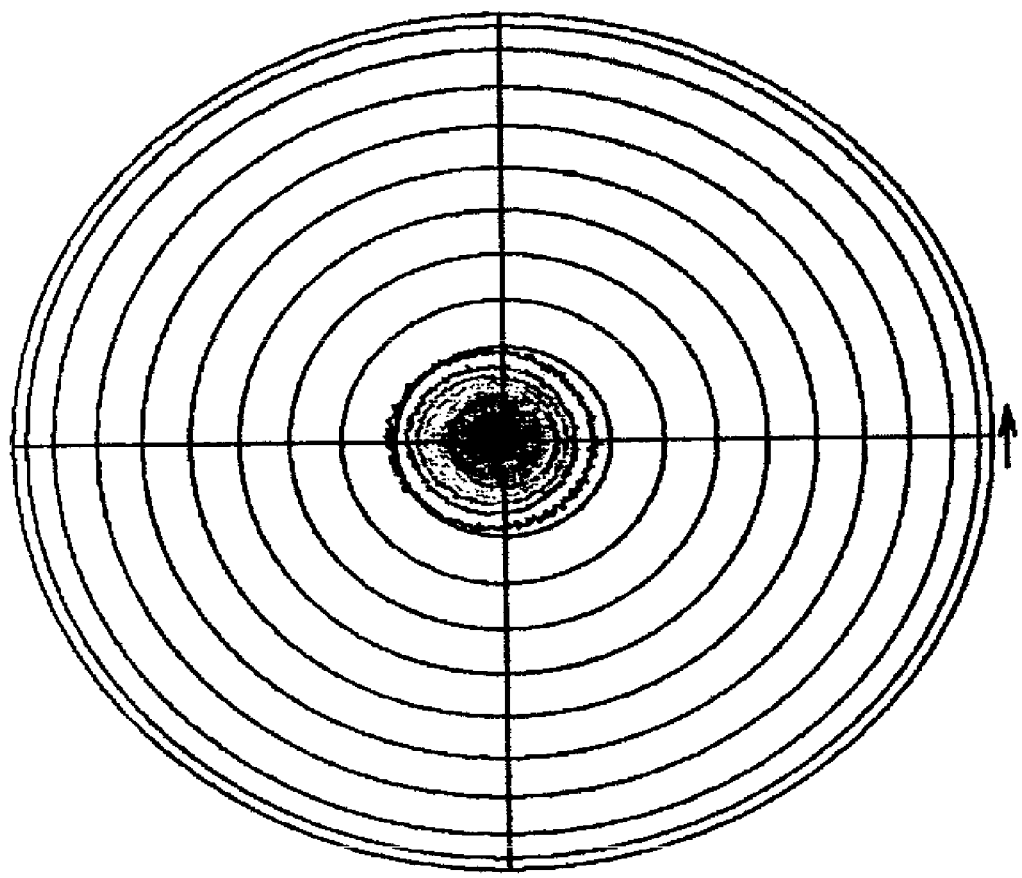
FIG. 12 is a ZnO (002) incident pole figure of X-ray diffraction of a sample with a $Ga_2O_3$ doping concentration of 4.1% by weight out of the range of preferred embodiments of the present invention.
Figure 13:
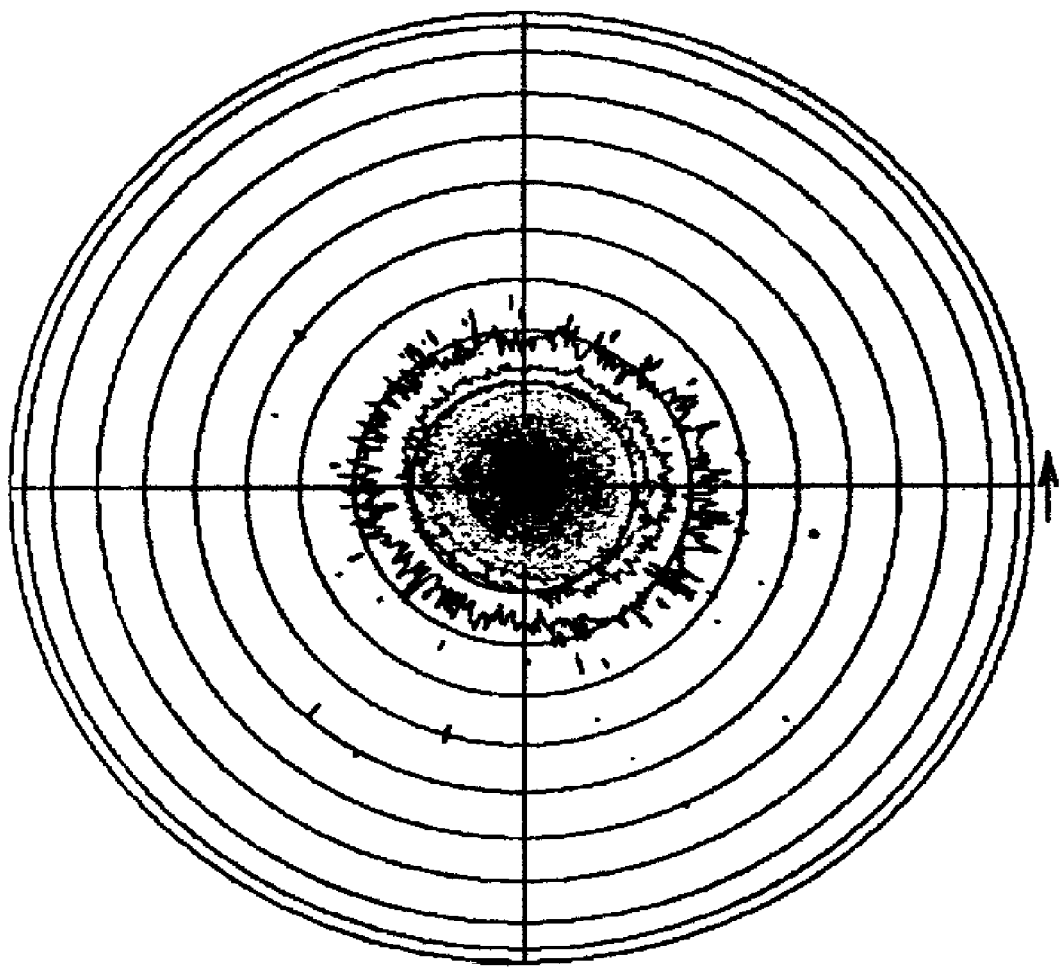
FIG. 13 is a ZnO (002) incident pole figure of X-ray diffraction of a sample with a $Ga_2O_3$ doping concentration of about 12.6% by weight within the range of preferred embodiments of the present invention.
Figure 14:
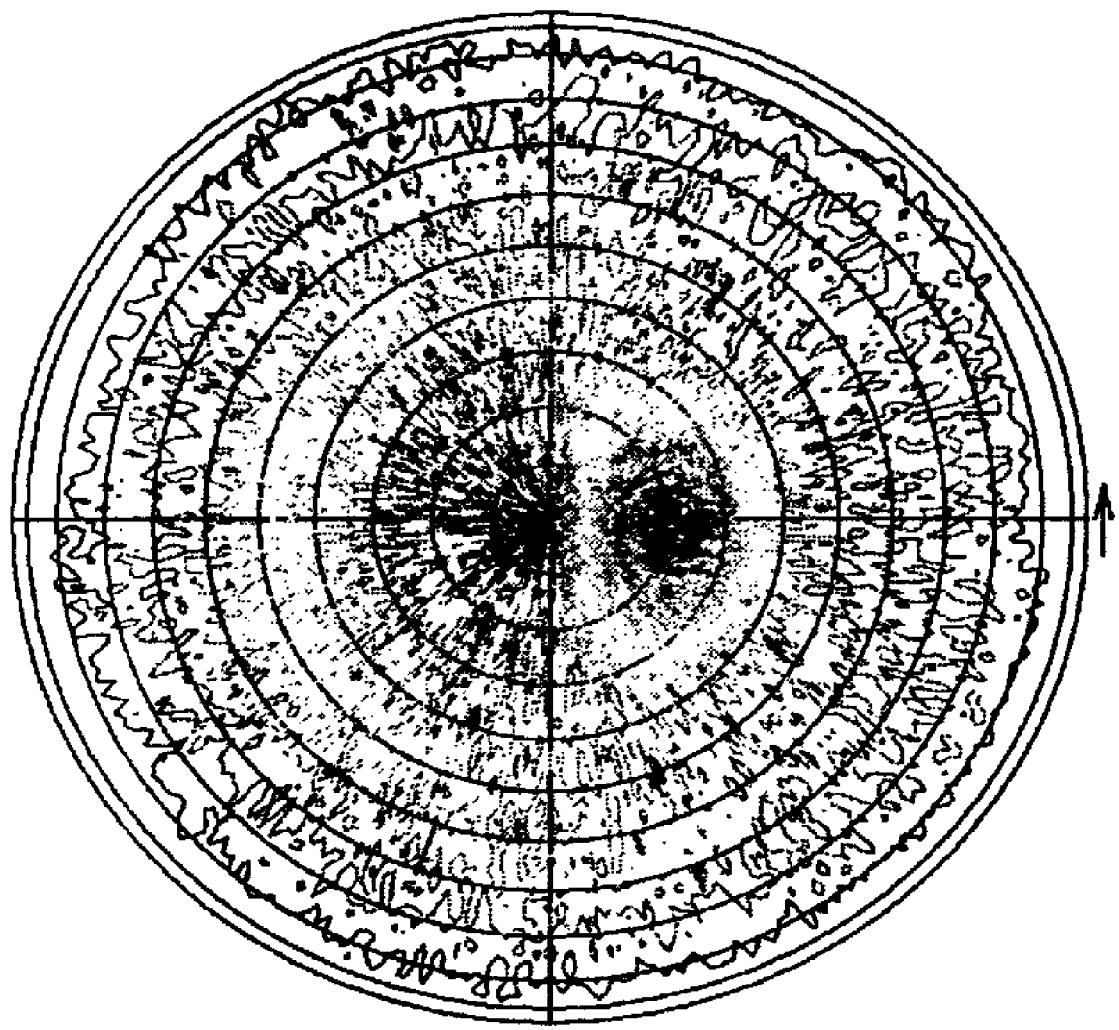
FIG. 14 is a ZnO (002) incident pole figure of X-ray diffraction of a sample with a $Ga_2O_3$ doping concentration of about 22.8% by weight within the range of preferred embodiments of the present invention.

FIG. 12 is a ZnO (002) incident pole figure of x-ray diffraction of the sample with a $Ga_2O_3$ doping concentration of about 4.1% by weight out of the range of preferred embodiments of the present invention, and FIGS. 13 and 14 are ZnO (002) incident pole figures of x-ray diffraction of the samples with $Ga_2O_3$ doping concentrations of about 12.6% by weight and about 22.8% by weight, respectively, within the range of preferred embodiments of the present invention.

FIG. 12 indicates that in the sample with a $Ga_2O_3$ doping concentration of as low as about 4.1% by weight out of the range of preferred embodiments of the present invention, the c-axes are uniformly oriented in the direction normal to the substrate.

On the other hand, FIG. 13 indicates that in the sample with a $Ga_2O_3$ doping concentration of about 12.6% by weight within the range of preferred embodiments of the present invention, the degree of uniformity of c-axis orientation is significantly decreased as compared with the sample out of the range of preferred embodiments of the present invention.

It is further found that in the sample with a $Ga_2O_3$ doping concentration of about 22.8% by weight within the range of preferred embodiments of the present invention, the degree of uniformity of c-axis orientation is significantly decreased as compared with the sample shown in FIG. 12 out of the range of preferred embodiments of the present invention.

Therefore, FIGS. 12, 13, and 14 also support the idea of preferred embodiments of the present invention that when c-axes grow in a plurality of different directions, re-oxidation of oxygen defects is suppressed to improve the moisture resistance.

Figure 15:
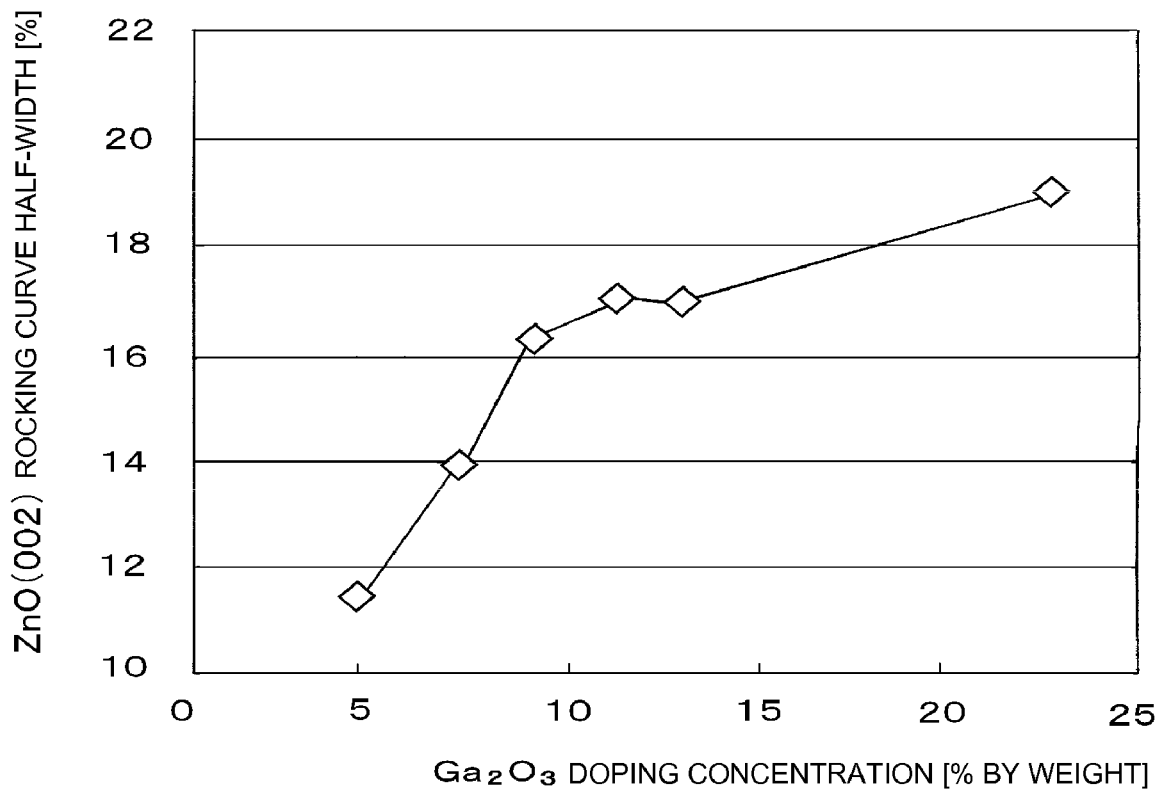
FIG. 15 is a graph showing the relationship between the $Ga_2O_3$ doping concentration and the ZnO (002) rocking curve half-width of a ZnO film (transparent conductive film).

FIG. 15 is a graph showing the relationship between the $Ga_2O_3$ doping concentration and the ZnO (002) rocking curve half-width.

FIG. 15 indicates that when the $Ga_2O_3$ doping concentration is about 7% by weight or more, the ZnO (002) rocking curve half-width is about 13.5° or more. With a ZnO (002) rocking curve half-width of about 13.5° or more, the degree of c-axis orientation in the ZnO film is decreased to improve the moisture resistance.

It was confirmed in Example 1 that a transparent conductive film having practicable moisture resistance can be formed on a general-purpose glass substrate.

From the viewpoint of realization of sufficiently low resistance, the group III element (doping element) is most preferably Ga. However, when another group III element such as Al or In is used, the same effect as that in use of Ga can be obtained.

Even when at least two types of group III elements, i.e., Ga and at least one of Al and In, are used for doping, the same effect can be obtained.

Furthermore, when group III element Ga and another dopant other than the group III elements are added, the basic effect of preferred embodiments of the present invention can be obtained.

EXAMPLE 2

In Example 1, description is made of the case in which the glass substrate was preferably used as the substrate on which the transparent conductive film was formed. However, in Example 2, a substrate (flexible substrate) composed of PEN (polyethylene naphthalate) was preferably used as a substrate on which a transparent conductive film was formed, and the substrate was pre-treated by the same method as in Example 1.

Like in Example 1, a ZnO sintered target having a sintering density of 80% or more and a diameter of 6 inches was prepared as a sputtering target.

Like in Example 1, doping pellets ($Ga_2O_3$ pellets) composed of a Ga oxide ($Ga_2O_3$) and having a diameter of 10 mm were prepared.

In Example 2, the $Ga_2O_3$ doping amount was controlled by controlling the number of the $Ga_2O_3$ pellets.

Sputtering was performed by the same method using the same sputtering apparatus under the same conditions as in Example 1 to form a Ga-doped ZnO film (transparent conductive film) on the PEN substrate (flexible substrate).

The formed ZnO film was patterned by wet etching, and then it was confirmed by a stylus-type level-difference meter that the thickness was the predetermined value.

The resistivity measured by four-probe measurement for each of the samples was as follows:

(1) When the number of the $Ga_2O_3$ pellets was 1, the resistivity was about $6.7 \times 10^{-4}$ Ωcm.

(2) When the number of the $Ga_2O_3$ pellets was 3, the resistivity was about $8.1 \times 10^{-4}$ Ωcm.

(3) When the number of the $Ga_2O_3$ pellets was 5, the resistivity was about $3.4 \times 10^{-3}$ Ωcm.

The sheet resistance was as follows:

(1) When the number of the $Ga_2O_3$ pellets was 1, the sheet resistance was about 15 Ω/sq.

(2) When the number of the $Ga_2O_3$ pellets was 3, the resistivity was about 20 Ω/sq.

(3) When the number of the $Ga_2O_3$ pellets was 5, the resistivity was about 77 Ω/sq.

When the number of the $Ga_2O_3$ pellets was any one of 1, 3, and 5, the light transmittance in the visible region reached 80% or more.

In addition, as a result of quantitative evaluation by ICP composition analysis, it was confirmed that in Example 2, the relationship between the number of the $Ga_2O_3$ pellets and the $Ga_2O_3$ doping concentration is as follows:

(1) When the number of $Ga_2O_3$ pellets is 1, the $Ga_2O_3$ doping concentration is about 5.5% by weight.

(2) When the number of $Ga_2O_3$ pellets is 3, the $Ga_2O_3$ doping concentration is about 14.8% by weight.

(3) When the number of $Ga_2O_3$ pellets is 5, the Ga2O3 doping concentration is about 28.5% by weight.

Figure 16:
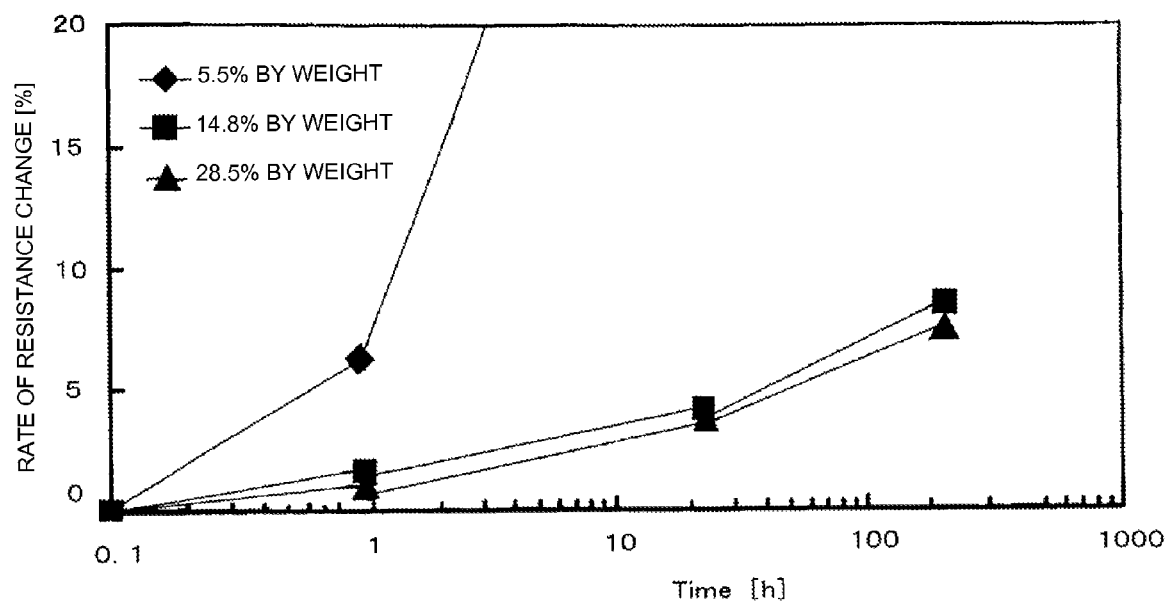
FIG. 16 is a graph showing the relationship between the elapsed time and the rate of resistance change in a moisture resistance test (85° C., 85% RH) for ZnO films (transparent conductive film) formed on a flexible substrate (PEN substrate) in Example 2 of preferred embodiments of the present invention.

Furthermore, the samples prepared in Example 2 were subjected to a moisture resistance test at high temperature and high humidity. As a result, as shown in FIG. 16, it was confirmed that with a number of $Ga_2O_3$ pellets of 1 and a $Ga_2O_3$ doping concentration of about 5.5% by weight, the rate of resistance change significantly increases with the passage of time. However, with a number of $Ga_2O_3$ pellets of 3 and a $Ga_2O_3$ doping concentration of about 14.8% by weight, the rate of resistance change (rate of increase) after the passage of 200 hours is about 8.8%, and with a number of $Ga_2O_3$ pellets of 5 and a $Ga_2O_3$ doping concentration of about 28.5% by weight, the rate of resistance change (rate of increase) after the passage of 200 hours is about 7.8%. It was thus confirmed that in both latter cases, the moisture resistance is significantly improved in comparison with the case in which the number of $Ga_2O_3$ pellets is 1 ($Ga_2O_3$ doping concentration of about 5.5% by weight).

It was confirmed in Example 2 that a ZnO-based transparent conductive film produced by the method of various preferred embodiments of the present invention can be applied to a so-called flexible device using a flexible substrate composed of PEN.

EXAMPLE 3

A Ga-doped ZnO film (transparent conductive film) was formed by the same sputtering method under the same conditions as in Example 2 except that a substrate (flexible substrate) composed of PET (polyethylene terephthalate) was preferably used instead of the substrate (flexible substrate) composed of PEN (polyethylene naphthalate) used in Example 2.

As a result of the measurement of the characteristics of the resulting ZnO film (transparent conductive film) under the same conditions as in Example 2, it was confirmed that the ZnO film (transparent conductive film) has the same characteristics as in Example 2.

It was thus confirmed that a practicable transparent conductive film can be formed on a substrate (flexible substrate) composed of general-purpose PET (polyethylene terephthalate).

EXAMPLE 4

A glass substrate composed of non-alkali glass (Corning 1737) was preferably used as a substrate, and the glass substrate was washed with isopropyl alcohol and UV irradiation to prepare a clean surface.

Also, as a sputtering target, a ZnO sintered target having a sintering density of 80% or more and a diameter of 4 inches was prepared.

Furthermore, pellets ($Ga_2O_3$ pellets) of 10 mm in diameter and composed of Ga oxide ($Ga_2O_3$) were prepared for doping.

In Example 4, the $Ga_2O_3$ pellets were placed on an erosion region of the ZnO sintered target and subjected to sputtering to form a $Ga_2O_3$-doped ZnO film on the substrate.

The amount of $Ga_2O_3$ doping was controlled by controlling the number of the $Ga_2O_3$ pellets.

In the sputtering, the glass substrate was set in a vacuum chamber of a sputtering apparatus and then sputtering was performed with a bias voltage of −80 V applied to the substrate without heating of the glass substrate after the chamber was evacuated to $5 \times 10^{-5}$ Pa.

In Example 4, high-purity Ar gas was used as sputtering gas, and the sputtering gas was introduced until the pressure in the vacuum chamber was 1 Pa.

The sputtering was started under the condition of a RF electric power of 250 W to form the ZnO film (transparent conductive film) having a predetermined thickness and doped with Ga at a predetermined ratio. The predetermined thickness of the formed ZnO film was 400 nm.

The formed ZnO film was patterned by wet etching, and then it was confirmed by a stylus-type level-difference meter that the film thickness was ±15% of the predetermined thickness.

The Ga doping concentration of the formed ZnO film was about 4.5% by weight, and the resistivity was about $8.3 \times 10^{-4}$ Ωcm.

Figure 17:
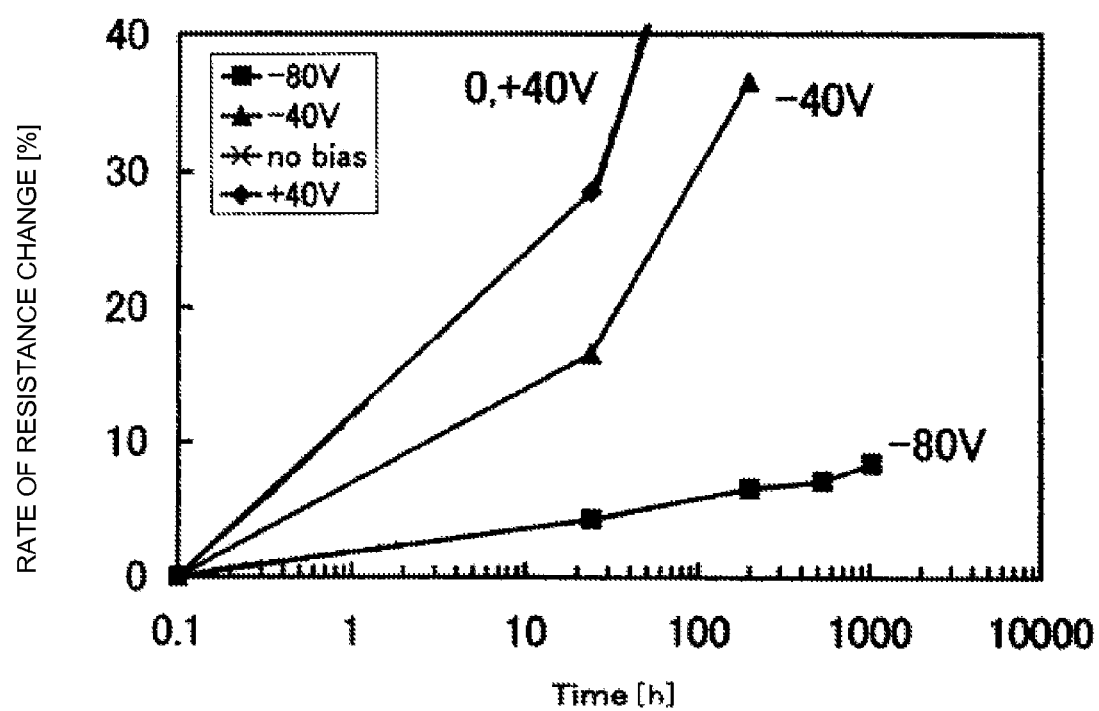
FIG. 17 is a graph showing the relationship between the elapsed time and the rate of resistance change in a moisture resistance test (85° C., 85% RH) for ZnO films (transparent conductive film) formed on a flexible substrate (PEN substrate) in Example 4 of preferred embodiments of the present invention.

Furthermore, the ZnO film was subjected to a moisture resistance test at 85° C. and 85% RH. As a result, as shown in FIG. 17, the rate of resistance change was as high as about ±10% after the passage of 1000 hours. FIG. 17 also shows data of the rate of resistance change with a bias voltage of −80 V applied to the substrate and data of the rate of resistance change measured for respective samples (transparent conductive films) prepared with bias voltages of −40 V, 0 V, and +40 V applied to the substrate.

As described above, it was confirmed that the ZnO film formed by sputtering with a bias voltage of −80 V applied to the glass substrate (substrate) has improved moisture resistance and a rate of resistance change of as high as about +10% after the passage of 1000 hours. In order to search for a cause of this, the bias voltage applied to the glass substrate (substrate) was changed to form transparent conductive films, and structural analysis was carried out.

Figure 18:
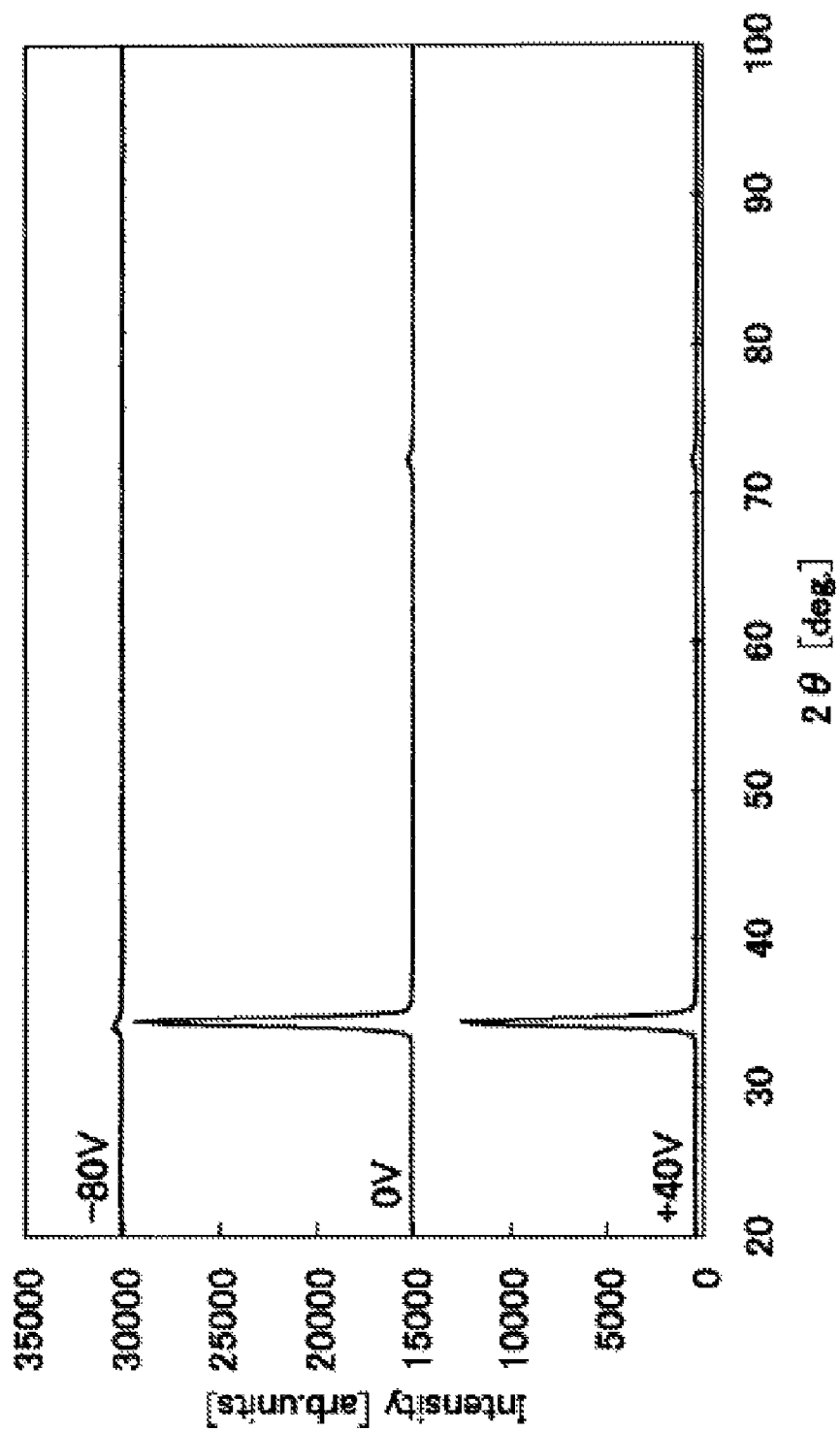
FIG. 18 is a chart showing the relationship between the bias voltage applied to a substrate and the c-axis orientation of a ZnO film (transparent conductive film).

FIG. 18 shows that when a minus bias voltage is applied, the c-axis peak tends to weaken as compared with the case in which a plus bias voltage or no bias voltage is applied, and the c-axis peak substantially disappears when a bias voltage of −80 V is applied.

FIGS. 19A to 19D are ZnO (002) incident pole figures of X-ray diffraction of the transparent conductive films prepared with bias voltages of −80 V, −40 V, 0 V, and +40 V applied to the substrates, respectively. As shown in FIG. 19A, it was confirmed that disturbance occurs in the x-axes in the transparent conductive film prepared with a bias voltage of −80 V applied to the glass substrate.

Figure 20:
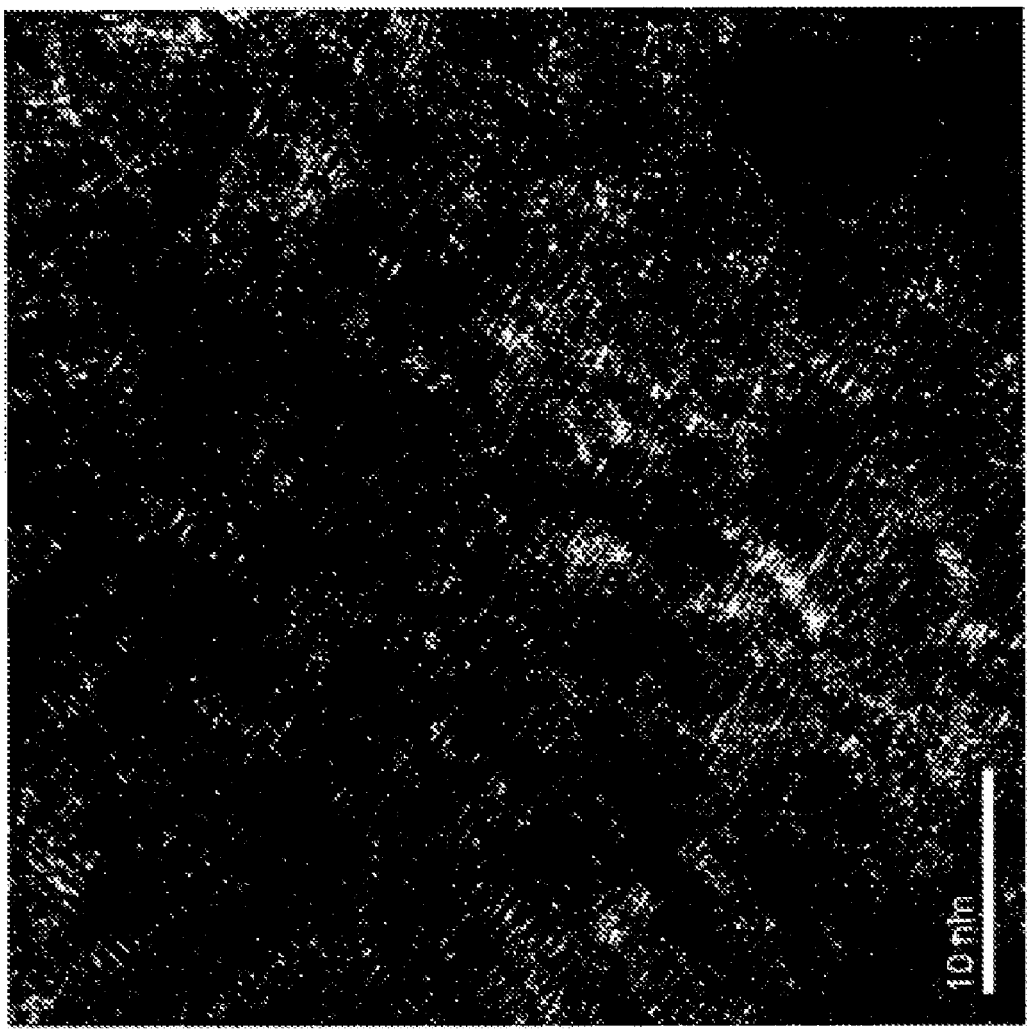
FIG. 20 is a view showing a transmission electron microscope image of a transparent conductive film prepared by the method of Example 4 of preferred embodiments of the present invention.

FIG. 20 is a transmission electron microscope image of the transparent conductive film prepared with a bias voltage of −80 V applied to the glass substrate. FIG. 20 indicates that the ZnO film prepared with a bias voltage of −80 V applied to the glass substrate is grown to have inclined c axes and the same crystal structure as a high-concentration doped film.

It was supposed that as in Examples 1 to 3, when a film is doped with a high concentration of group III element (Ga), the moisture resistance is improved based on a mechanism in which the activation energy of H2O diffusion is increased by disturbance in the c-axis columnar structure due to doping with a high concentration of group III element (Ga). However, it is thought that when a ZnO film is formed by sputtering with a bias voltage applied to a glass substrate, the moisture resistance is improved by the suppression of C-axis columnar growth due to the bombardment effect of Ar+ ions and capture of Ar+ ions in the film.

Table 1 shows the results of WDX (wavelength dispersive X-ray elemental analysis) of the Ar content in each ZnO film.

TABLE 1

| Bias voltage | Content (% by weight) | | | | | | | |
|---|---|---|---|---|---|---|---|---|
| (V) | O | Si | Ar | Ca | Zn | Ga | Sb | Ba |
| −80 | 25.8 | 2.9 | 0.6 | 0.6 | 64.3 | 3.4 | 0.4 | 2.0 |
| −80 | 24.6 | 2.5 | 0.8 | 0.5 | 66.4 | 3.1 | 0.3 | 1.8 |

TABLE 1-continued

| Bias voltage | Content (% by weight) | | | | | | | |
|---|---|---|---|---|---|---|---|---|
| (V) | O | Si | Ar | Ca | Zn | Ga | Sb | Ba |
| −40 | 24.3 | 1.9 | 0.2 | 0.4 | 68.3 | 2.9 | 0.5 | 1.6 |
| 0 | 23.4 | 1.7 | 0.2 | 0.4 | 69.0 | 3.7 | 0.3 | 1.3 |
| +40 | 23.9 | 1.9 | 0.2 | 0.5 | 68.4 | 3.3 | 0.3 | 1.5 |

Table 1 reveals that the amount of Ar captured increases as the absolute value of the negative bias voltage increases.

Figure 21:
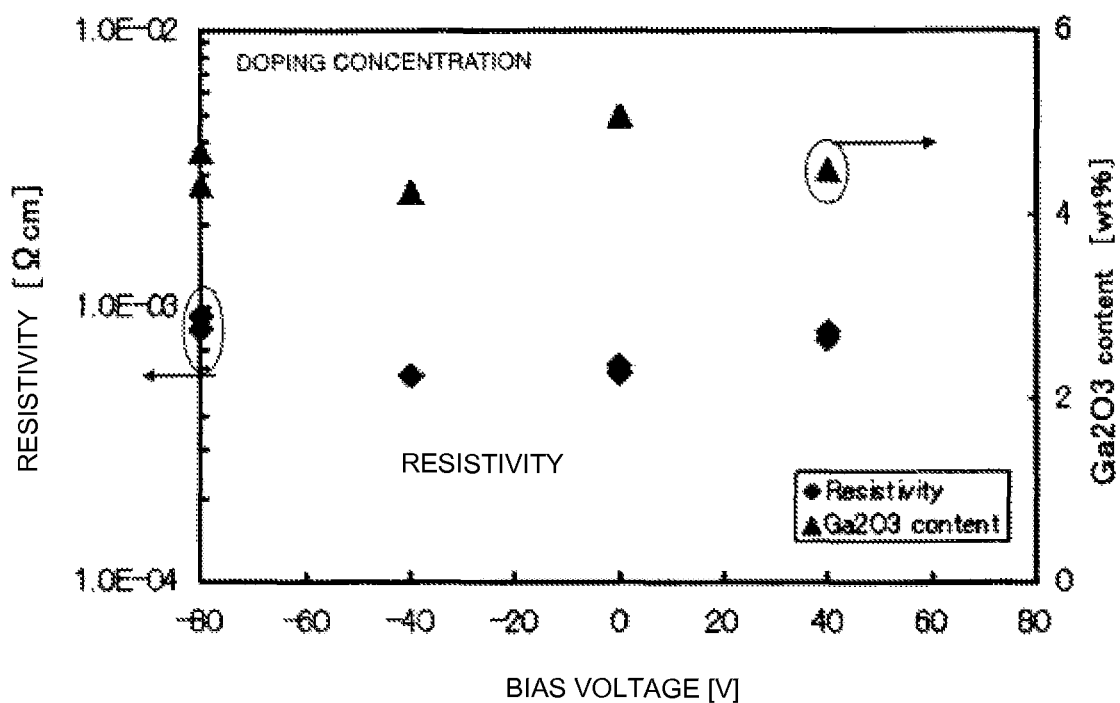
FIG. 21 is a graph showing the relationship between the bias voltage applied to a substrate and resistivity and the $Ga_2O_3$ doping concentration.

FIG. 21 is a graph showing the relationship between the bias voltage applied to the glass substrate and resistivity and the $Ga_2O_3$ doping concentration.

FIG. 21 shows that the bias voltage applied to the glass substrate has substantially no influence on the resistivity. Therefore, it is possible to realize both lower resistance and higher moisture resistance by film formation with a bias voltage applied to a glass substrate.

In Example 4, when the transparent conductive film is formed with a bias voltage applied to the glass substrate, the type of doping element is most preferably Ga from the viewpoint of lower resistance. However, even when another group III element of Al or In is used, the same effect can be expected. In addition, when Ga and Al or In are used, the same effect can be expected.

In Example 4, the transparent conductive film having high moisture resistance can be obtained by thin film formation with a minus bias voltage applied to the glass substrate. However, the sign of the bias voltage applied to the substrate and the value (absolute value) of the bias voltage are preferably optimum conditions according to the conditions such as the type of the group III element used and the doping concentration. In some cases, a thin film is preferably formed with a plus bias voltage of a value (absolute value) different from that in Example 4.

EXAMPLE 5

A Ga-doped ZnO film (transparent conductive film) was formed by the same sputtering method with a bias voltage applied to a flexible substrate composed of PET (polyethylene terephthalate) under the same conditions as in Example 4 except that the flexible substrate was used instead of the non-alkali glass substrate used in Example 4.

As a result of the measurement of the characteristics of the resulting ZnO film (transparent conductive film) under the same conditions as in Example 4, it was confirmed that the ZnO film (transparent conductive film) has the same characteristics as in Example 4.

It was thus confirmed that a practicable transparent conductive film can be formed on a substrate (flexible substrate) composed of general-purpose PET (polyethylene terephthalate).

Although, in each of Examples 1 to 5, the ZnO film preferably was (transparent conductive film) formed on the glass substrate, the PEN substrate, or PET substrate, a ZnO film can be formed on a single-crystal substrate of glass, quartz, sapphire, or Si. In this case, the same effects as in the formation on the glass substrate can be obtained.

In each of Examples 1 to 5, description is preferably made of the case in which the ZnO film (transparent conductive film) is formed directly on the substrate. However, when a ZnO film (transparent conductive film) is formed on a substrate permeable to water, such as a flexible substrate, the ZnO film (transparent conductive film) may be formed on the substrate with a SiNx thin film provided therebetween. In this case, the moisture resistance of the transparent conductive film can be further improved, and the rate of resistance change after the passage of 1000 hours in a moisture resistance test can be made zero.

In view of other points, the present invention is not limited to the above-described examples of preferred embodiments thereof, and various applications and changes of the shape and constituent material type of a substrate on which a transparent conductive film is formed, the type and doping amount of a group III element, and the specified film formation conditions for a transparent conductive film can be made within the scope of the present invention.

As described above, according to various preferred embodiments of the present invention, it is possible to efficiently and securely produce a ZnO-based transparent conductive film having practicable moisture resistance and the required characteristics as a transparent conductive film, and with excellent economy.

Therefore, the present invention can be widely used for applications such as transparent electrodes of a flat-panel display and a solar cell.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A transparent conductive film comprising:
   zinc oxide doped with a group III element and grown on a substrate; wherein
   the transparent conductive film has a region with a crystal structure in which c axes are oriented in a plurality of different directions; and
   a zinc oxide (002) rocking curve half-width is about 13.5° or more.

2. The transparent conductive film according to claim 1, wherein zinc oxide is a main component and a group III element oxide is included at a ratio of about 7% to about 40% by weight.

3. The transparent conductive film according to claim 1, wherein the transparent conductive film is disposed on the substrate with a SiNx thin film provided therebetween.

4. The transparent conductive film according to claim 1, wherein the substrate contains, as a main component, at least one of glass, quartz, sapphire, Si, SiC, polyethylene terephthalate, polyethylene naphthalate, polyether sulfone, polyimide, cycloolefin polymers, and polycarbonate.

5. The transparent conductive film according to claim 1, wherein the group III element is at least one element selected from the group consisting of Ga, Al, and In.

* * * * *